(12) United States Patent  (10) Patent No.: US 7,419,845 B2
Rueckes et al.  (45) Date of Patent: *Sep. 2, 2008

(54) METHODS OF MAKING ELECTROMECHANICAL THREE-TRACE JUNCTION DEVICES

(75) Inventors: Thomas Rueckes, Portland, OR (US); Brent M. Segal, Woburn, MA (US); Darren K. Brock, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 195 days.

This patent is subject to a terminal disclaimer.

(21) Appl. No.: 11/188,678

(22) Filed: Jul. 25, 2005

(65) Prior Publication Data

US 2005/0281084 A1 Dec. 22, 2005

Related U.S. Application Data

(63) Continuation of application No. 10/824,679, filed on Apr. 15, 2004, now Pat. No. 6,979,590, which is a continuation of application No. 10/033,032, filed on Dec. 28, 2001, now Pat. No. 6,784,028.

(51) Int. Cl.
*H01L 21/00* (2006.01)

(52) U.S. Cl. ............... 438/52; 438/50; 257/E21.038; 257/E51.023

(58) Field of Classification Search ............ 438/99, 438/50, 52; 257/40, E21.038, E51.04, E51.038; 977/742, 977

See application file for complete search history.

(56) References Cited

U.S. PATENT DOCUMENTS 4,979,149 A  12/1990 Popovic et al.
5,677,823 A  10/1997 Smith et al.
6,100,109 A   8/2000 Melzner et al.
6,128,214 A  10/2000 Kuekes et al.
6,250,984 B1  6/2001 Jin et al.
6,256,767 B1  7/2001 Kuekes et al.
6,314,019 B1 11/2001 Kuekes et al.
6,423,583 B1  7/2002 Avouris et al.

(Continued)

FOREIGN PATENT DOCUMENTS

GB  2 364 933 A    2/2002
WO  WO-97/29538    8/1997
WO  WO-00/48195    8/2000
WO  WO-00/50771    8/2000
WO  WO-01/03208 A1 1/2001

OTHER PUBLICATIONS

Avouris, P., et al., "Carbon Nanotube Electronics," Chemical Physics, 2002, vol. 284, pp. 429-445.

(Continued)

*Primary Examiner*—Quoc D Hoang
(74) *Attorney, Agent, or Firm*—Wilmer Cutler Pickering Hale and Dorr LLP

(57) ABSTRACT

Methods of producing an electromechanical circuit element are described. A lower structure having lower support structures and a lower electrically conductive element is provided. A nanotube ribbon (or other electromechanically responsive element) is formed on an upper surface of the lower structure so as to contact the lower support structures. An upper structure is provided over the nanotube ribbon. The upper structure includes upper support structures and an upper electrically conductive element. In some arrangements, the upper and lower electrically conductive elements are in vertical alignment, but in some arrangements they are not.

16 Claims, 24 Drawing Sheets

U.S. PATENT DOCUMENTS

| | | | |
|---|---|---|---|
| 6,426,687 | B1 | 7/2002 | Osborn |
| 6,436,221 | B1 * | 8/2002 | Chang et al. ............... 156/247 |
| 6,443,901 | B1 | 9/2002 | Fraser |
| 6,445,006 | B1 | 9/2002 | Brandes et al. |
| 6,548,841 | B2 | 4/2003 | Frazier et al. |
| 6,706,402 | B2 | 3/2004 | Rueckes et al. |
| 6,707,098 | B2 | 3/2004 | Hofmann et al. |
| 6,759,693 | B2 | 7/2004 | Vogeli et al. |
| 6,784,028 | B2 * | 8/2004 | Rueckes et al. ............ 438/128 |
| 6,803,840 | B2 | 10/2004 | Hunt et al. |
| 6,809,462 | B2 | 10/2004 | Pelrine et al. |
| 6,809,465 | B2 | 10/2004 | Jin |
| 6,918,284 | B2 | 7/2005 | Snow et al. |
| 6,919,592 | B2 | 7/2005 | Segal et al. |
| 6,919,740 | B2 | 7/2005 | Snider |
| 6,924,538 | B2 | 8/2005 | Jaiprakash et al. |
| 6,955,937 | B1 | 10/2005 | Burke et al. |
| 6,969,651 | B1 | 11/2005 | Lu et al. |
| 6,979,590 | B2 * | 12/2005 | Rueckes et al. ............... 438/99 |
| 6,990,009 | B2 | 1/2006 | Bertin et al. |
| 7,015,500 | B2 | 3/2006 | Choi et al. |
| 7,115,901 | B2 | 10/2006 | Bertin et al. |
| 7,115,960 | B2 | 10/2006 | Bertin et al. |
| 7,161,403 | B2 | 1/2007 | Bertin |
| 2001/0023986 | A1 | 9/2001 | Mancevski |
| 2002/0175390 | A1 | 11/2002 | Goldstein et al. |
| 2003/0200521 | A1 | 10/2003 | DeHon et al. |
| 2004/0181630 | A1 | 9/2004 | Jaiprakash et al. |
| 2004/0238907 | A1 | 12/2004 | Pinkerton et al. |
| 2005/0056877 | A1 | 3/2005 | Rueckes et al. |
| 2005/0065741 | A1 | 3/2005 | Segal et al. |
| 2005/0068128 | A1 | 3/2005 | Yip |
| 2006/0237537 | A1 | 10/2006 | Empedocles et al. |
| 2006/0237799 | A1 | 10/2006 | Lu et al. |
| 2006/0278902 | A1 | 12/2006 | Sun et al. |

OTHER PUBLICATIONS

Bachtold, A. et al., "Logic Circuits wiht Carbon Nanotube Transistors", *Science*, Nov. 9, 2001, vol. 294, pp. 1317-1320.

Bradley, K. et al., "Flexible Nanotube Electronics," *Nano Letters*, vol. 3, No. 10, pp. 1353-1355, 2003.

Chen, J. et al., "Self-aligned carbon nanotube transistors with charge transfer doping", *Applied Physics Letters*, vol. 86, pp. 123108-1-123108-3, 2005.

Chen, J. et al., "Self-aligned Carbon Nanotube Transistors with Novel Chemical Doping", *IEDM*, pp. 29.4.1-29.4.4, 2004.

Dequesnes, M. et al., "Calculation of pull-in voltages for carbon-nanotube-based nanoelectromechanical switches," *Nanotechnology*, Jan. 22, 2002, vol. 13, pp. 383-386.

Derycke, V. et al., "Controlling doping and carrier injection in carbon nanotube transistors", *Applied Physics Letters*, vol. 80, No. 15, pp. 2773-2775, Apr. 15, 2002.

Derycke, V., et al., "Carbon Nanotube Inter- and Intramolecular Logic Gates," *Nano Letters*, Sep. 2001, vol. 1, No. 9, pp. 453-456.

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistors", *Physical Review Letters*, vol. 89, No. 10, pp. 16801-1-106801-4, 2002.

Huang, Y., et al., "Logic Gates and Computation from Assembled Nanowire Building Blocks," *Science*, Nov. 9, 2001, vol. 294, pp. 1313-1316.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", *Nature Materials*, vol. 1, pp. 241-246, Dec. 2002.

Javey, A., et al., "Carbon Nanotube Transistor Arrays for Multistage Complementary Logic and Ring Oscillators," *Nano Letters*, 2002, vol. 2, No. 9, pp. 929-932.

Kaneto et al., "Electrical conductivities of multi-wall carbon nano tubes", *Synthethic Materials*, Elsevier Science, SA., vol. 203, pp. 2543-2546, 1999.

Lin, Y.M. et al., "Novel Carbon Nanotube FET Design with Tunable Polarity", *IEDM*, pp. 292.1-29.2.4, 2004.

Martel, R., et al., "Carbon Nanotube Field-Effect Transistors and Logic Circuits," *DAC 2002*, Jun. 10-12, 2002, vol. 7.4, pp. 94-98.

Radosavljevic, M. et al., "Nonvolatile Molecular Memory Elements Based on Ambipolar Nanotube Field Effect Transistors", *Nano Letters*, vol. 2, No. 7, pp. 761-764, 2002.

Rueckes, T., et al., "Carbon Nanotube-Based Nonvolatile Random Access Memory for Molecular Computing," *Science*, Jul. 7, 2000, vol. 289, pp. 94-97.

Stadermann, M., et al., "Nanoscale study of conduction through carbon nanotube networks," *Phys. Rev. B69*, 201402(R), 2004.

Wind, S. J. et al., "Fabrication and Electrical Characterization of Top Gate Single-Wall Carbon Nanotube Field-Effect Transistors", 14 pages.

Wind, S. J. et al., "Vertical scaling of carbon nanotube field-effect transistors using top gate electrodes", *Applied Physics Letters*, vol. 80, No. 20, pp. 3817-3819, May 20, 2002.

* cited by examiner

METHODS OF MAKING ELECTROMECHANICAL THREE-TRACE JUNCTION DEVICES

CROSS REFERENCE TO RELATED APPLICATIONS

This application is a continuation of and claims priority under 35 U.S.C. §120 to U.S. patent application Ser. No. 10/824,679 filed on Apr. 15, 2004, entitled Methods Of Making Electromechanical Three-Trace Junction Devices, which is a continuation of U.S. patent application Ser. No. 10/033,032 filed on Dec. 28, 2001, entitled Methods Of Making Electromechanical Three-Trace Junction Devices.

This application is related to the following applications, the contents of which are incorporated herein in their entirety by reference:

- U.S. patent application Ser. No. 09/915,093 filed Jul. 25, 2001 (now U.S. Pat. No. 6,919,592) entitled Electromechanical Memory Array Using Nanotube Ribbons And Method For Making Same;
- U.S. patent application Ser. No. 09/915,173 filed Jul. 25, 2001 (now U.S. Pat. No. 6,643,15) entitled Electromechanical Memory Having Cell Selection Circuitry Constructed With Nanotube Technology; and
- U.S. patent application Ser. No. 09/915,095 filed Jul. 25, 2001 (now U.S. Pat. No. 6,574,130) entitled Hybrid Circuit Having Nanotube Electromechanical Memory.

BACKGROUND

1. Technical Field

This invention relates in general to nonvolatile memory devices and, in particular, to nonvolatile memory arrays that use electromechanical nanotube technology.

2. Discussion of Related Art

Typical memory devices involve single-bit memory cells that have either an "on" state or an "off" state. One bit of memory storage is determined by either the "on" or "off" condition. The number of bits is dependent directly upon the number of memory cells in a particular memory array. For example, a device, which stores n bits, must have n memory cells. In order to increase the number of memory cells either the overall size of the memory array must increase or the size of each memory element must decrease. Increases in memory cell density have been achieved by improving lithographic techniques that have allowed progress from the production of micron-sized elements to the delineation of nanometer-sized features.

Important characteristics for a memory cell in an electronic device are low cost, high density, low power, high speed and nonvolatility. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long (millisecond) write cycles and low relative speed in comparison to DRAM or SRAM. Flash also has a finite number of read/write cycles leading to low long-term reliability. ROM, PROM, EPROM and EEPROM are all nonvolatile, meaning that if power to the memory is interrupted the memory will retain the information stored in the memory cells.

DRAM stores charges on transistor gates that act as capacitors, but its need to be electrically refreshed every few milliseconds complicates system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

As the discussion above indicates, conventional memory solutions fail to possess all the desired characteristics. Existing technologies that are nonvolatile are not randomly accessible and have low density, high cost, and limited ability to allow multiple writes with high reliability of circuit function. Meanwhile, existing technologies that are volatile complicate system design or have low density. Some emerging technologies have attempted to address these shortcomings.

For example, magnetic RAM (MRAM) or ferromagnetic RAM (FRAM) utilizes the orientation of magnetization or a ferroelectric region to generate a nonvolatile memory cell. To obtain nonvolatility, MRAM utilizes magnetoresistive memory elements involving the anisotropic magnetoresistance or giant magnetoresistance of magnetic multilayer structures. However, both of these types of memory cells have relatively high resistance and low density. A different MRAM memory cell based upon magnetic tunnel junctions has also been examined but has not led to large-scale commercialized devices.

FRAM uses a similar circuit architecture but stores information not in magnetic cells but in thin-film ferroelectric devices. These devices are purported to yield a nonvolatile memory by retaining their electrical polarization after an externally applied electric switching field is removed. However, FRAM suffers from a large memory cell size, and material incompatibility with standard semiconductor CMOS fabrication processes that makes it difficult to manufacture large-scale integrated components. See U.S. Pat. Nos. 4,853,893; 4,888,630; 5,198,994

Another technology having nonvolatile memory is phase change memory. This technology stores information via a structural phase change in thin-film alloys incorporating elements such as selenium or tellurium. These alloys are purported to remain stable in both crystalline and amorphous states, and the fact that these states are electrically distinct allows the formation of bistable switches. Nonetheless, while the nonvolatility condition is met, this technology appears to suffer from slow operations, difficulty of manufacture and reliability problems, and has not reached a state of commercialization. See U.S. Pat. Nos. 3,448,302, 4,845,533, 4,876,667 and 6,044,008.

Wire crossbar memory (MWCM) has also been proposed. See U.S. Pat. Nos. 6,128,214, 6,159,620 and 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain nonvolatility owing to the inherent instability found in redox processes.

Recently, memory devices have been proposed which use nanoscopic wires, such as single-walled carbon nanotubes, to form crossbar junctions to serve as memory cells. See WO 01/03208 ("Nanoscopic Wire-Based Devices, Arrays, and Methods of Their Manufacture"), and Thomas Rueckes et al., "Carbon Nanotube-Based Nonvolatile Random Access Memory for Molecular Computing," *Science*, vol. 289, pp. 94-97 (2000). Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectifying junction. When electrical power is removed from the junction, the wires retain their physical (and thus electrical) state thereby forming a nonvolatile memory cell.

The NTWCM proposals to date rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may be difficult to control the statistical variance of geometries of nanotube wires so grown.

SUMMARY

Methods of producing an electromechanical circuit element are provided.

According to one aspect of the invention, a lower structure having lower support structures and a lower electrically conductive element is provided. A nanotube ribbon (or other electromechanically responsive element) is formed on an upper surface of the lower structure so as to contact the lower support structures. An upper structure is provided over the nanotube ribbon. The upper structure includes upper support structures and an upper electrically conductive element.

Under another aspect of the invention, the upper and lower electrically conductive elements are in vertical alignment.

Under another aspect of the invention, the upper and lower electrically conductive elements are not in alignment.

BRIEF DESCRIPTION OF THE DRAWINGS

In the accompanying drawings,

FIGS. 6-8 illustrate more particular acts of forming electromechanical devices according to certain embodiments of the invention;

FIGS. 13-18 illustrate more particular acts of forming electromechanical devices according to certain embodiments of the invention.

DETAILED DESCRIPTION

Figure 1:
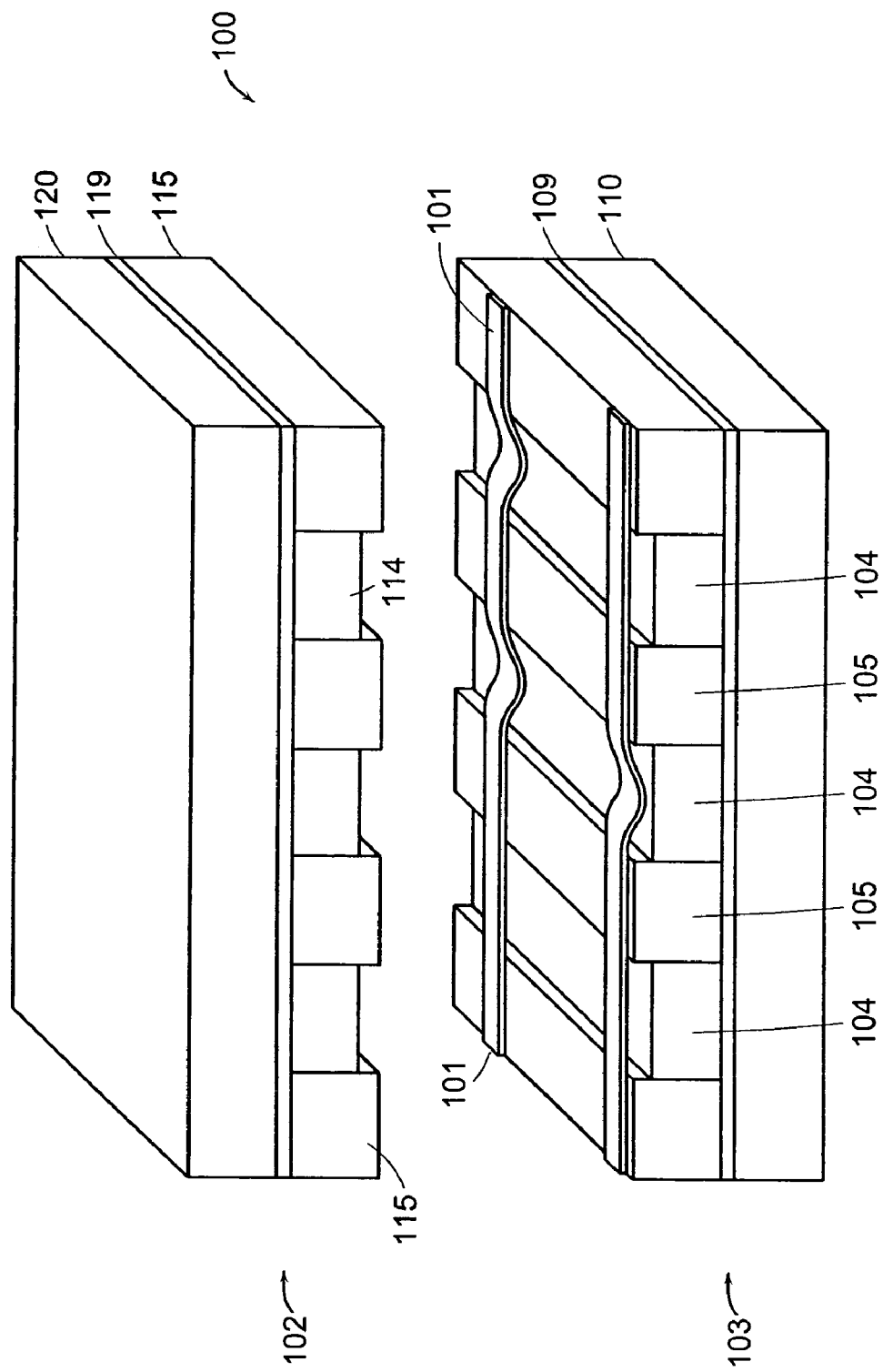
FIG. 1 illustrates a nanotube belt crossbar memory device according to certain embodiments of the invention.

Preferred embodiments of the invention provide new electromechanical circuit elements and methods of making the same. In particular, three trace nanotube-technology devices are shown and methods of making same are described. As will be explained below, the use of three traces (1) facilitates tristable logic that may achieve higher memory storage and/or information densities, (2) improves reliability and speed of switching a given element or cell, and (3) improves fault tolerance of an element or cell. Moreover, certain embodiments effectively enclose the three-trace junctions, facilitating their use, fabrication, and distribution, especially in the case of hybrid circuits.

In short, preferred embodiments of the present invention include electromechanical circuit junctions formed from at least three crossing junctions, only one of which needs to be an electromechanically responsive trace. Though the electromechanically responsive trace may be formed from a carbon nanotube, nanotube rope, or a belt or wire made of another appropriate material, certain preferred embodiments form such a trace as a nanotube ribbon disposed between the other two traces. (The term "trace" is not intended to be limiting to any particular geometry or fabrication technique and instead is intended to broadly cover an electrically conductive path.)

As will be explained below, three trace devices facilitate tristable logic that may achieve higher memory storage and/or information densities. By having more than two states, a given electromechanical element may be used to represent more than binary information. For example, in a tristable arrangement, one state may represent 0, another 1, and the other 2.

The three trace device may also be used to improve the reliability and speed of switching a given element. For example, by positioning an electromechanically responsive trace between two other traces, the two other traces may be stimulated to act in concert upon the electromechanically responsive trace. One trace may be stimulated to repulse the electromechanically responsive trace, and the other may be stimulated to attract the electromechanically responsive trace.

The three trace device may also be used to improve the fault tolerance of an element or cell. For example, if one of the traces becomes inoperative, the other may be used in its place. Alternatively, two traces may be used to operate in concert, but the circuit may be designed in such a way that if one of the traces fails, the circuit continues to operate as long as the other traces remain operative.

Certain preferred embodiments use nanotube ribbons to implement electromechanically responsive traces. Consequently, these embodiments constitute a new set of nanotube ribbon crossbar memory (NTRCM) devices. NTRCM versions of the invention enjoy the same advantages over nanotube wire crossbar memory (NTWCM) versions that NTRCM two-trace junction devices enjoyed over their NTWCM counterparts. See U.S. application Ser. No. 09/915, 093 (now U.S. Pat. No. 6,919,592) entitled "Electromechanical Memory Array Using Nanotube Ribbons and Method for Making Same;" U.S. application Ser. No. 09/915,173 (now U.S. Pat. No. 6,643,165) entitled "Electromechanical Memory Having Cell Selection Circuitry Constructed with Nanotube Technology" and U.S. application Ser. No. 09/915, 095 (now U.S. Pat. No. 6,574,130) all of which are incorporated by reference in their entirety. The belt structures of NTRCM devices are believed to be easier to build at the desired levels of integration and scale (in number of devices made), and their geometries are more easily controlled. Furthermore, large-scale integration of these nanotube ribbons is straightforward in a way that allows for a large degree of redundancy in architecture, and thus increased reliability.

FIG. 1 illustrates an exemplary electromechanical memory array 100 in exploded view. In this embodiment, the array contains a layer of nanotube ribbons 101 between an upper structure 102 and a lower structure 103.

The lower structure 103 includes a plurality of generally parallel electrically conductive traces 104, disposed between generally parallel and upwardly-protruding supports 105. The traces 104 and supports 105 are generally perpendicular to the ribbons 101. The traces and supports are arranged over a gate oxide layer 109 and silicon substrate 110.

The upper structure 102 is similar to the lower structure. The upper structure 102 includes a plurality of generally parallel electrically conductive traces 114, disposed between generally parallel and downwardly-protruding supports 115. The traces 114 and supports 115 are generally perpendicular to the ribbons 101. The traces and supports are arranged over a gate oxide layer 119 and silicon substrate 120.

For both the upper and lower structures 102, 103, the electromechanically responsive elements 101 are nanotube ribbons. However, other materials, including nanotubes, may be used. Under certain preferred embodiments, a nanotube ribbon 101 has a width of about 180 nm and is pinned to insulating supports 102 (more below).

For both the upper and lower structures 102, 103, the traces 104, 114 may be made of any suitable electrically conductive material and may be arranged in any of a variety of suitable geometries. Certain preferred embodiments utilize n-doped silicon to form such traces, preferably no wider than the nanotube belt 101, e.g., about 180 nm.

For both the upper and lower structures 102, 103, the supports 102 and 112, likewise, may be made of a variety of materials and geometries, but certain preferred embodiments utilize insulating material, such as spin-on-glass (SOG). The preferred thickness (height) must equal or exceed the height of the electrodes preferably from 100 nm to 1 micron.

As will be explained below, under certain embodiments, the ribbons 101 are held between the contacting supports by friction. In other embodiments, the ribbon may be held by other means, such as by anchoring the ribbons to the supports using any of a variety of techniques. The nanotube ribbons 101 are also pinned to the upper surfaces of lower supports 102 by the upper supports being deposited on top of the lower supports. Evaporated or spin-coated material such as metals, semiconductors or insulators—especially silicon, titanium, silicon oxide or polyimide—may be used to increase the pinning strength. The friction interaction can be increased through the use of chemical interactions, including covalent bonding through the use of carbon compounds such as pyrenes or other chemically reactive species. See R. J. Chen et al., "Noncovalent Sidewall Functionalization of Single-Walled Carbon Nanotubes for Protein Immobilization," J. Am. Chem. Soc., vol. 123, pp. 3838-39 (2001), and Dai et al., Appl. Phys. Lett., vol. 77, pp. 3015-17 (2000), for exemplary techniques for pinning and coating nanotubes by metals. See also WO 01/03208 for techniques.

Each instance where a ribbon crosses corresponding, oppositely-disposed traces defines a memory or logic cell. The actual number of such cells is immaterial to understanding the invention, but the technology may support devices having information storage capacities at least on the order of modern nonvolatile circuit devices.

Figure 2:
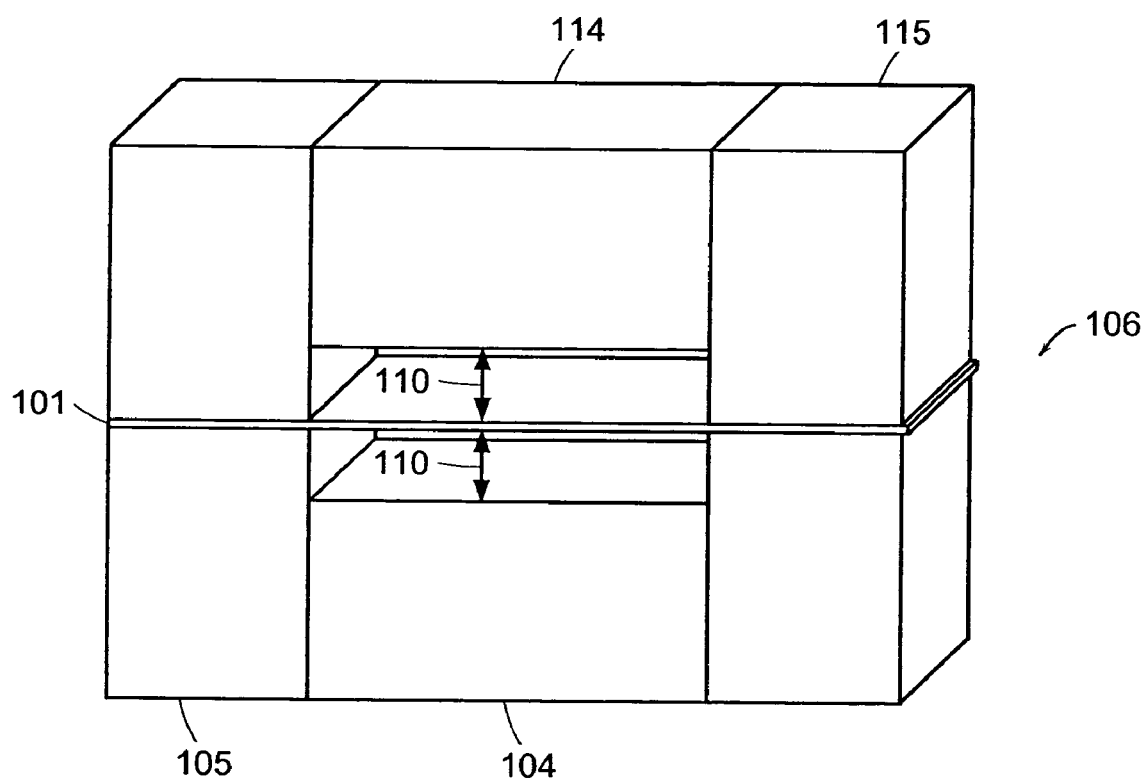
FIGS. 2-4 illustrate three states of a memory cell according to certain embodiments of the invention.
Figure 3:
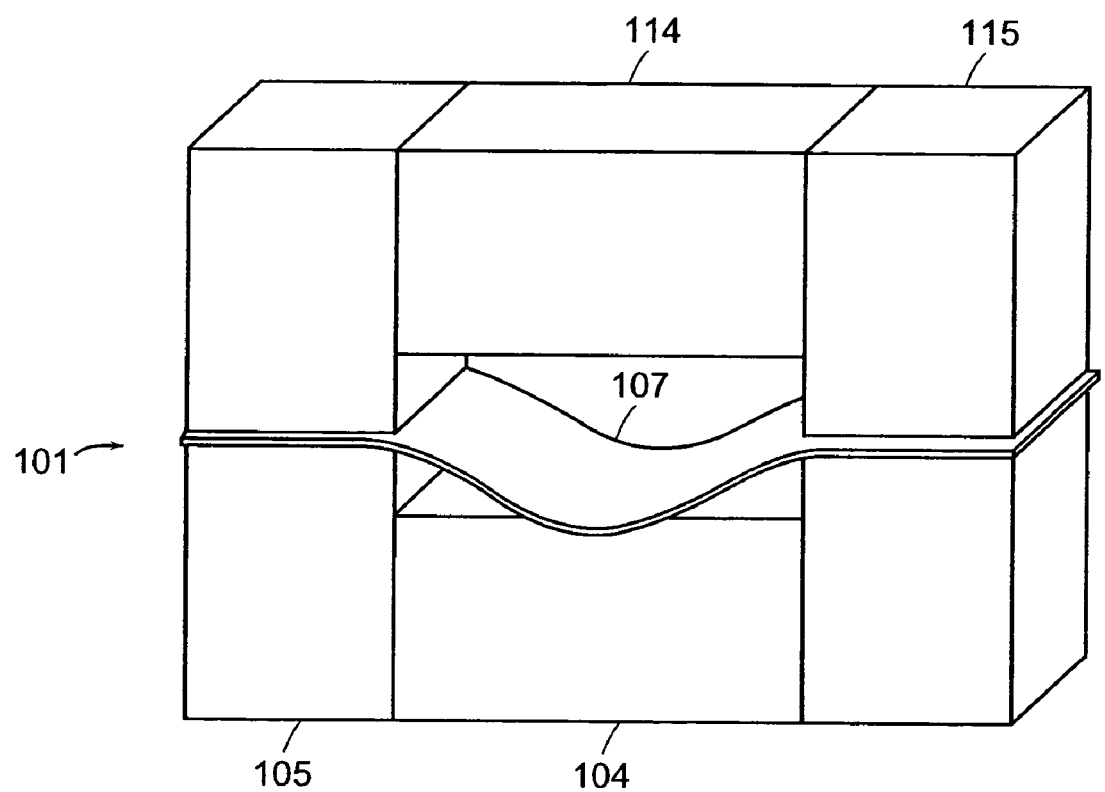
Figure 4:
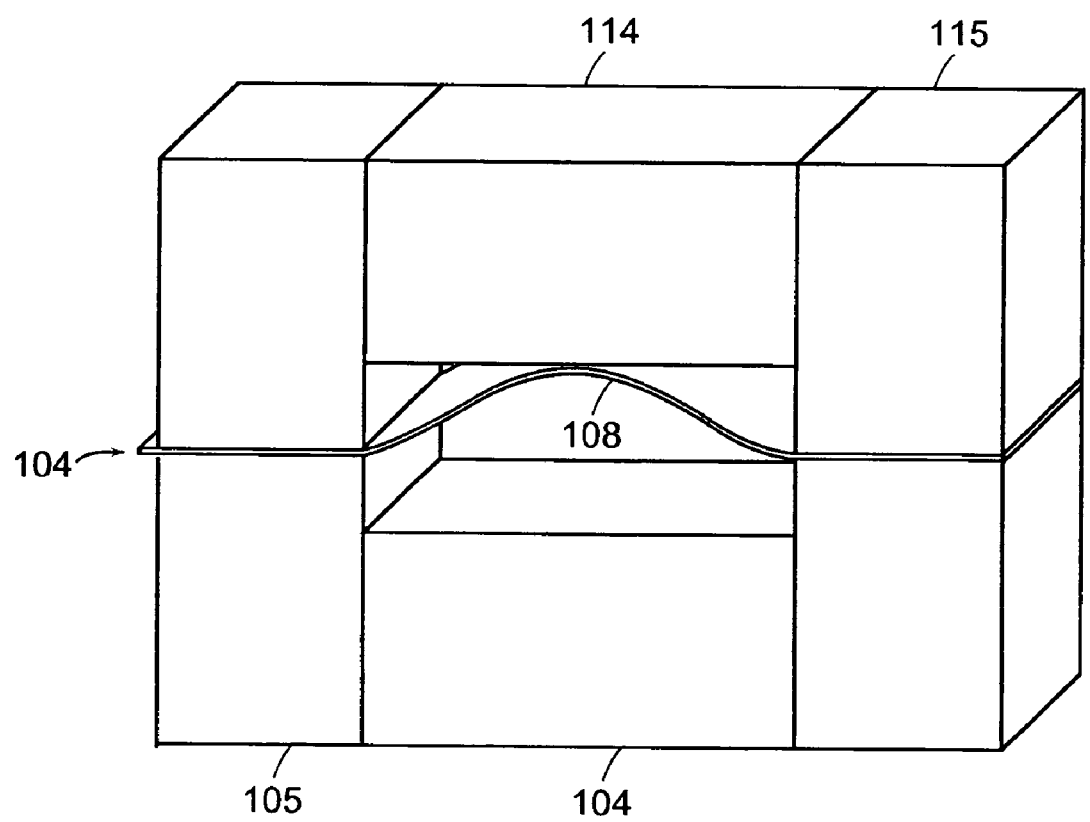
Figure 5A:
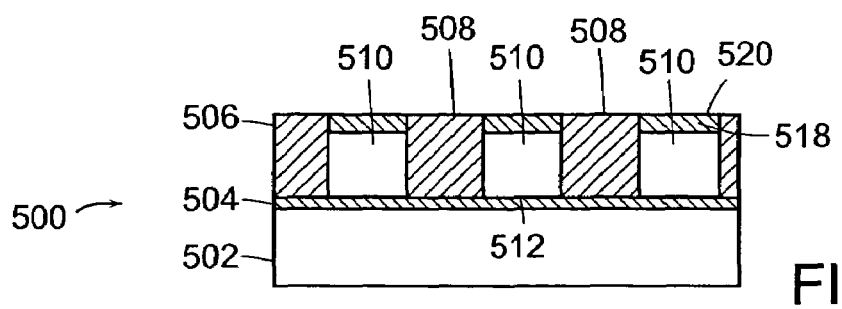
FIG. 5 illustrates exemplary acts of forming electromechanical devices according to certain embodiments of the invention.
Figure 5B:
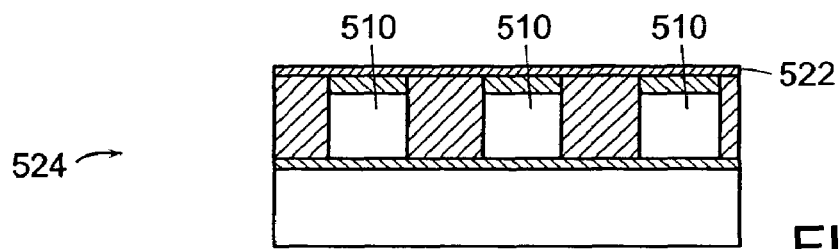
Figure 5C:
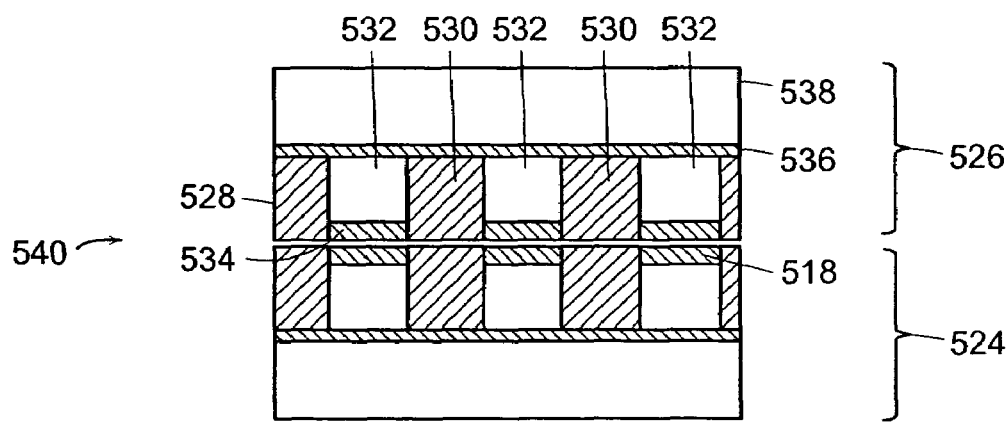
Figure 5D:
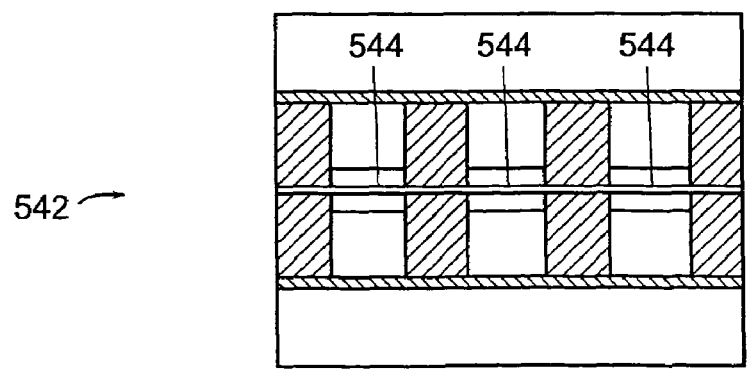

FIGS. 2-4 are cross-sectional diagrams of a cell and illustrate various states of the device. For example, a given cell may be used to have three states assigned as "on" and "off" states. State 106 may be assigned as an "off," and states 107 and 108 may be assigned as "on" states 107 and 108.

When the device is in state 106, the ribbon 101 is separated from both electrically conductive traces 104 and 114 by a distance 110. (The figure may suggest that the distances 110 between the ribbon and a corresponding trace is equal, but they need not be.) This state may be electrically detected in any of a variety of ways described in the foregoing references incorporated by reference. When the cell is in state 107, shown in FIG. 3, the ribbon is deflected toward trace 104. When the cell is in state 108, shown in FIG. 4, the ribbon is deflected toward trace 114. In this arrangement, an "off" state corresponds to the ribbon-trace junction being an open circuit, which may be sensed as such on either the ribbon 101 or trace 104 when addressed. In the "on" states, the ribbon-trace junction is an electrically conducting, rectifying junction (e.g., Schottky or PN), which may be sensed as such on either the ribbon 101 or trace 104 when addressed.

Under certain embodiments in which the lateral spacing between the supports 102 is about 180 nm, the relative separation 110 from the top of an insulating support 102 to the deflected position where the belt 101 attaches to electrode 104 or 114 should be approximately 5-50 nm. The magnitude of the separation 110 is designed to be compatible with electromechanical switching capabilities of the memory device. The 5-50 nm separation is preferred for certain embodiments utilizing ribbons 101 made from carbon nanotubes, and reflects the specific interplay between strain energy and adhesion energy for the deflected nanotubes. Other separations may be preferable for other materials.

Switching between these states is accomplished by the application of specific voltages across the nanotube belt or wire 101 and one or more of its associated conductive traces 104, 114. Switching forces are based on the interplay of electrostatic attraction and repulsion between the nanotube ribbon and the electrodes.

In certain embodiments, there is a high ratio between resistances in the "off" and the two "on" states. The differences between resistances in the "off" and "on" states provides a means to read which state a junction is in. In one approach, a "readout current" is applied to the nanotube belt or electrode and the voltage across the junction is determined with a "sense amplifier" on the traces. Reads are non-destructive, meaning that the cell retains its state, and no write-back operations are needed as is required with semiconductor DRAMs.

As alluded to above, the three-trace junctions of preferred embodiments bring their own advantages. By allowing for use of tristable memory cells, more information may be stored or represented by a given cell. Moreover, even if only one of the "on" states were used, three-trace junctions may increase switching speeds from the ability to use both conductive traces in concert to apply forces to move an electromechanically responsive trace 101. Furthermore, advantages in increased reliability and defect tolerance can come from the redundancy permitted, by the presence of two conductive traces in each cell. Each of the two conductive traces may be separately used to apply forces to move an electromechanically responsive trace, and each of the two conductive traces may serve as the "contact" for one of two alternative "on" states. Thus, the failure of one conductive trace may not be fatal to junction performance. In addition, by disposing the ribbons 101 between upper and lower structures 102, 103, the ribbons are effectively sealed and protected. Among other things this facilitates packaging and distribution, and it allows the nanotube-technology arrays to be more easily incorporated into other circuit and systems such as hybrid circuits. The lateral nature of the electrical architecture can also facilitate the production of stackable memory layers and the simplification of various interconnects.

FIG. 5 illustrates a method of making certain embodiments of NTRCM devices 100. A first intermediate structure 500 is created or provided as explained in the incorporated patent applications, cited above. The structure 500 includes a silicon substrate 502 having a gate dielectric layer 504 (such as silicon dioxide) and an insulating support layer 506 (such as spin-on-glass (SOG)) that contains a plurality of supports 508. In this instance, the supports 508 are formed by rows of patterned insulating material, though many other arrangements are possible, such as a plurality of columns.

Conductive traces 510 extend between supports 508. These conductive electrodes can be fabricated from a single material such as n-doped silicon or from a combination of material layers including metal and silicon layers. Acceptable materials for the conductive electrodes include copper, titanium, tungsten, and platinum, or other metals or semiconductors, such as silicon, compatible with standard fabrication lines. In this instance, the traces 510 are shown as essentially contacting the supports 508, but other arrangements are possible, as are other geometries, such as ones characterized by non-rectangular transverse cross-sections (e.g., triangular or trapezoidal).

Sacrificial layers 518 are disposed above the conductive traces 510 so as to define one planar surface 520 with the upper surface of the supports 508. This planar surface, as has been explained previously in the incorporated applications, facilitates growth of a non-woven fabric of single-walled carbon nanotubes (SWNTs) which is primarily one nanotube thick.

Under certain embodiments, a nanotube film is first grown on surface 520 and then patterned, e.g., by photolithography and etching, to define a layer of ribbons 522 (see also 101 in FIG. 1). The ribbons of non-woven nanotube fabric lie on the planar surface 520 and cross (for example, perpendicularly) the underlying traces 510. The resulting intermediate structure 524 is the lower structure 102 referred to above, with the exception that structure 524 includes the sacrificial layer 518.

The lower intermediate structure 524 may be formed in many ways. Several such ways are described in the incorporated patent applications, cited above. In addition, various ways are implicitly suggested through the description below of different ways of constructing analogous structures sitting on top of the lower array.

An upper intermediate structure 526 may be formed separately, and it may be placed on top of the patterned carbon nanotube film layer 522 to yield intermediate structure 540. Like the lower intermediate structure 524, the upper intermediate structure 526 includes an insulating support layer 528 (e.g., SOG) that contains a plurality of supports 530. In the pictured embodiment, the supports 530 consist of rows of patterned insulating material, but, as with the lower structure, many arrangements are possible, such as ones containing a plurality of columns. Moreover, the insulating supports may be made from a variety of materials.

Conductive traces 532, separated from the nanotubes by a second set of sacrificial layers 534, extend between supports 530. The conductive traces 532 are shown as essentially contacting the supports 530, but other arrangements and geometries are possible, as described for the conductive traces 510 in intermediate 500. A gate dielectric layer 536 and a conductive ground layer 538 are deposited on top of the supports 530 and traces 532.

To generate the target structure 542 featuring suspended, tristable nanotube junctions 544, the lower and upper sacrificial layers 518 and 534, respectively, have to be removed from intermediate structure 540, as by using wet or dry chemical etchants including acids or bases.

Before describing methods for producing the upper array 526 in greater detail, a few aspects regarding the fabrication process and its product are worth pointing out. The first is that the various growth, patterning, and etching operations may be performed using conventional techniques, such as lithographic patterning. Currently, these techniques can lead to feature sizes (e.g., the width of ribbon 101) of about 180 nm to as low as 130 nm, but the physical characteristics of the components are amenable to even smaller feature sizes that may be accessible to future manufacturing processes.

A second point is that, because the nanotube ribbons are in place before construction of the upper array begins, there is some more flexibility in the choice of materials for the upper array. In particular, while the choice of materials for the lower electrodes is limited to those substances that will survive the high temperature of the nanotube growth process, the choice of materials for the upper electrodes is not so constrained.

The final point is that interconnect fabrication can be applied using standard metallization and CMOS logic or using nanoelectromechanical addressing as previously explained in the incorporated patent applications, cited above. Such addressing can also be done utilizing a tristable nanoelectromechanical addressing logic scheme.

Three possible methods for generating the upper intermediate structure 526 are described in connection with FIGS. 6A-B, FIGS. 7A-B, and FIGS. 8A-B.

Figures 1, 6A:
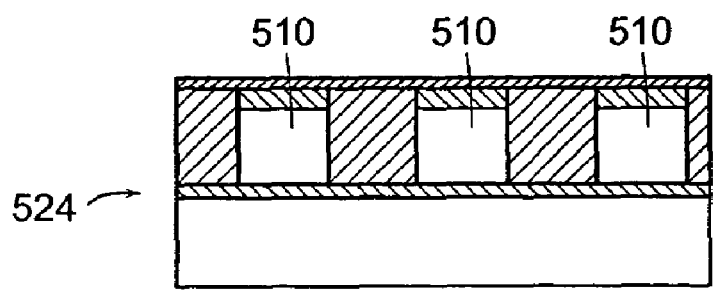
Figures 2, 6A:
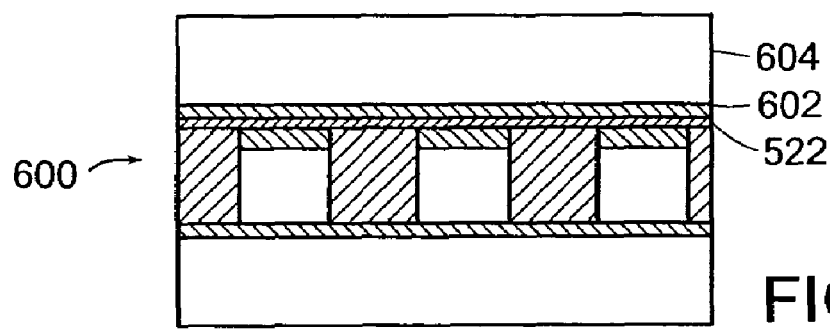
Figures 3, 6A:
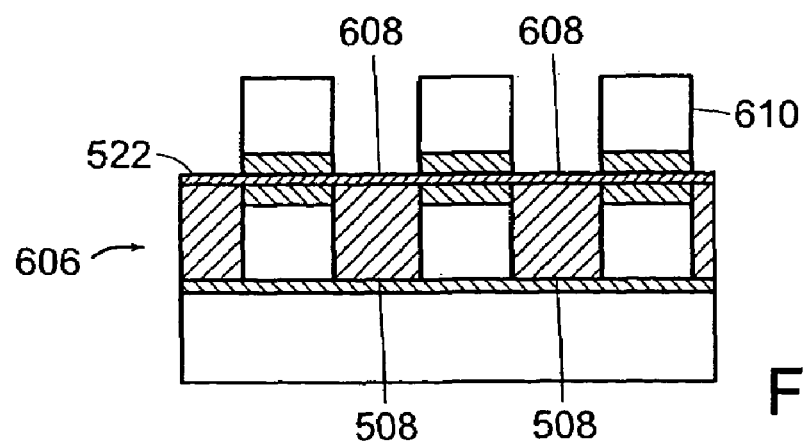
Figures 1, 6B:
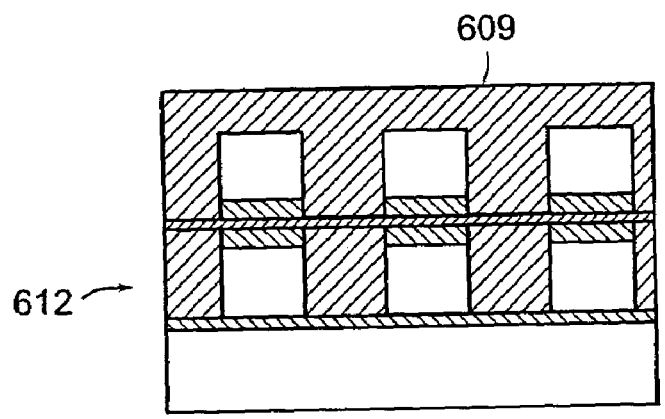
Figures 2, 6B:
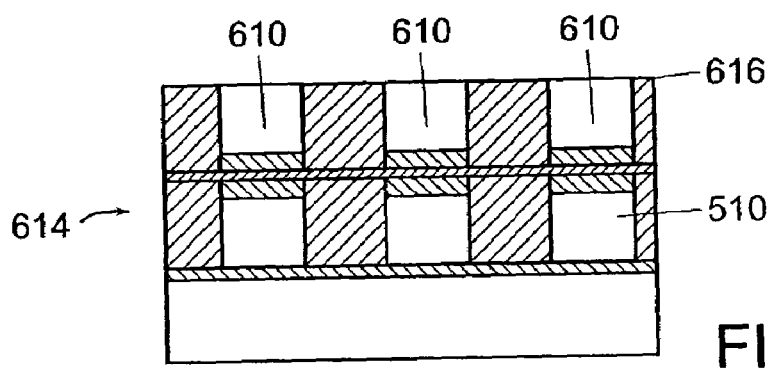
Figures 3, 6B:
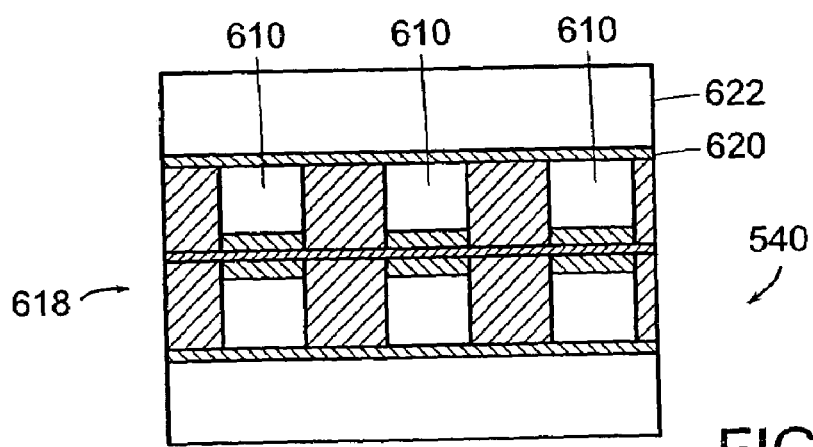

FIGS. 6A-B show one approach for producing a three-trace structure 542. A lower intermediate structure 524 is provided or constructed using the techniques identified above. A sacrificial layer 602 (about 10-20 nm high) and an n-doped silicon layer 604 are then added using a CVD process, sputtering, electroplating, or a different deposition process.

To generate the conductive traces 610, a photoresist layer may be spin-coated on layer 604 and subsequently exposed and developed to create cavities which lie directly over the underlying supports 508.

Reactive ion etching (RIE) or the like may then be used to etch the electrode and sacrificial layers 604 and 602 to form cavities 608 and to define upper-layer electrodes 610 that are positioned directly above the underlying electrodes 510. As shown in FIG. 6B, the cavities 608 are then filled and covered with a planar layer 609 of insulating material such as spin-on-glass (SOG) or polyimide. The insulating layer 609 is backetched with RIE or a plasma to the same height as the electrodes 610 so as to form a planar surface 616. A gate dielectric layer 620 is provided above the surface 616 to separate the electrodes 610 from the upper electrical ground layer 622. This layer 622 serves the additional purpose of providing a hermetic seal covering the entire memory structure.

The resulting intermediate structure 540 is then processed so that the lower and upper sacrificial layers 518 and 534, respectively, are removed to result in structure 542, as discussed above in connection with FIG. 5.

Figures 1, 7A:
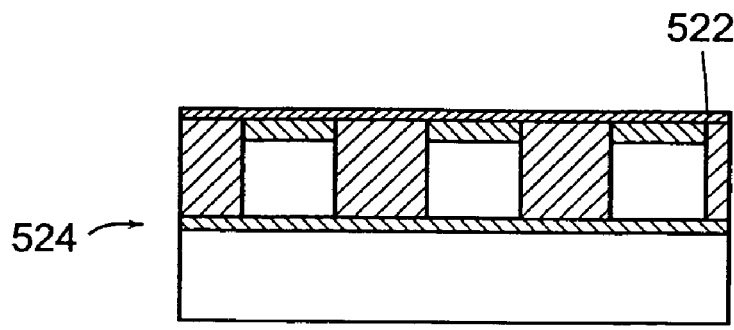
Figures 2, 7A:
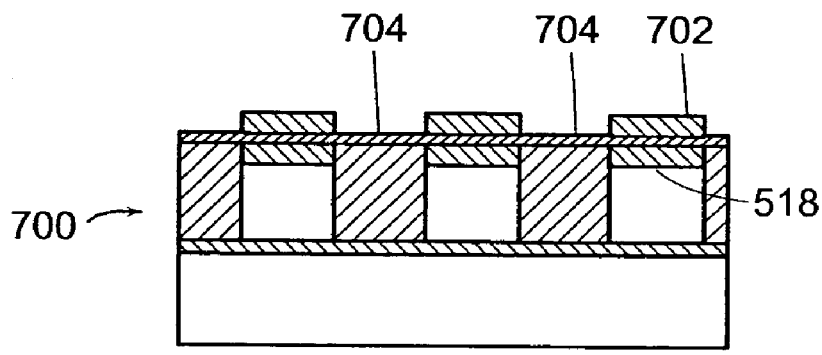
Figures 3, 7A:
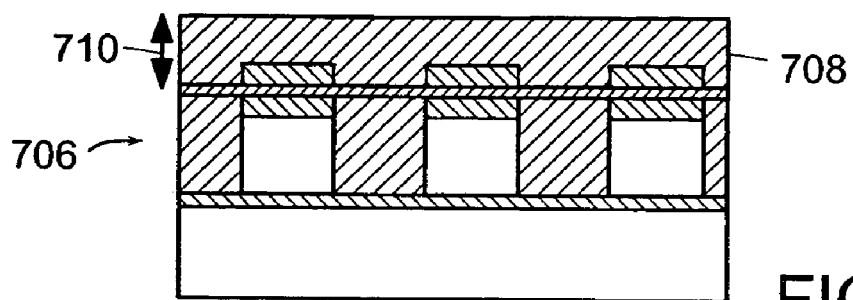
Figures 1, 7B:
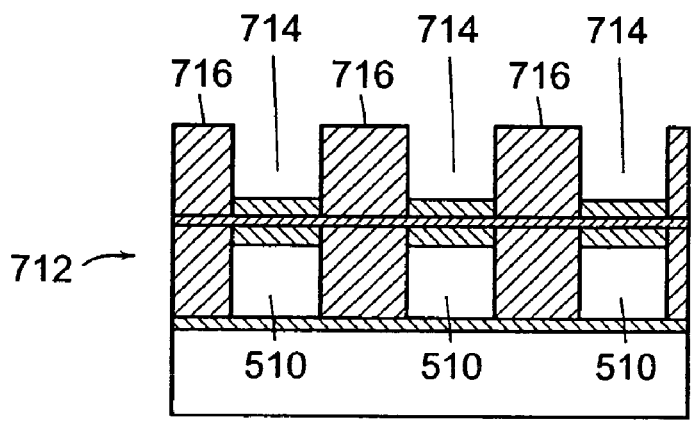
Figures 2, 7B:
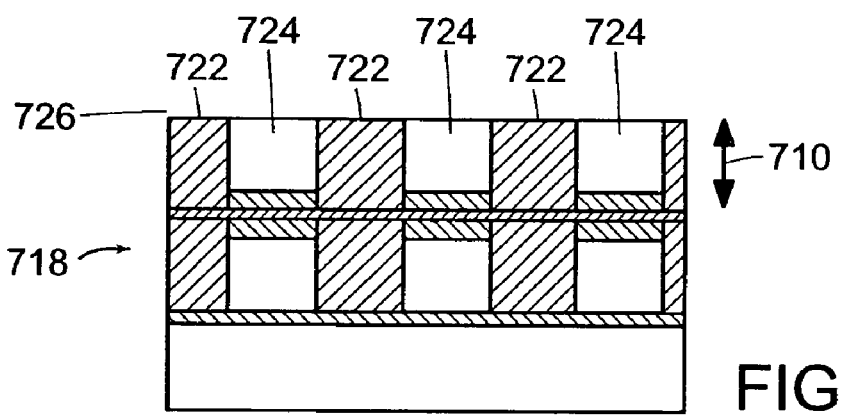
Figures 3, 7B:
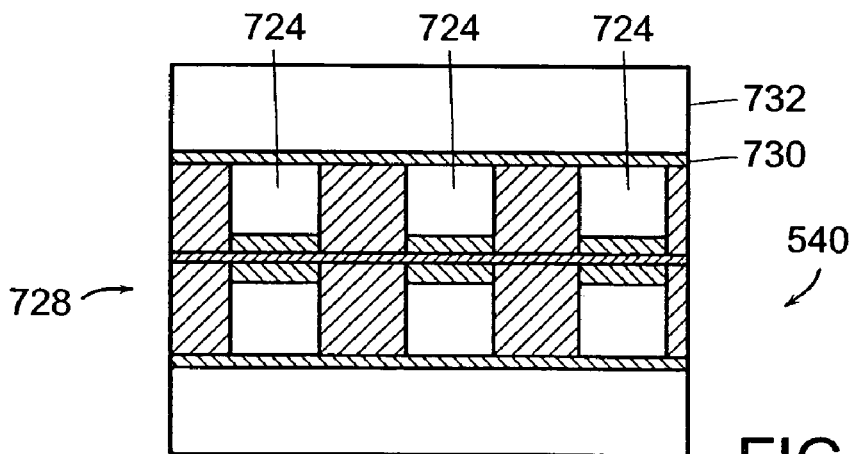

FIGS. 7A-B show another approach for producing a three trace structure 542. A lower intermediate structure 524 like that described in connection with FIG. 5 is provided or constructed. A sacrificial layer 702 (about 10-20 nm high) can be selectively grown directly above the underlying sacrificial layer 518, e.g., by using a selective CVD process involving self-complementary materials such as titanium, to produce intermediate structure 700. The resulting cavities 704 are filled and covered with a planar layer 708 of an insulating material such as spin-on-glass (SOG) or polyimide. The insulating layer 708 is backetched with RIE or a plasma to a height 710 equal to the intended total height of the upper sacrificial layer 702 and the upper conductive electrodes 724. A photoresist layer may be spin-coated on layer 708 and subsequently exposed and lithographically developed to create cavities which lie directly over the underlying electrodes 510.

As illustrated by FIG. 7B, reactive ion etching (RIE) or the like may then be used to etch the upper support layer 708 to form cavities 714 and to define the upper supports 716. The cavities 714 are filled and covered with a planar layer consisting of n-doped silicon or other suitable electrode-forming materials, and this layer is backetched with RIE or a plasma to the same height 710 as the remaining portions of the support layer 722, the result being intermediate 718. The top surfaces of the upper electrodes 724 and the supports 722 form a planar surface 726. A gate dielectric layer 730 is deposited on top of intermediate structure 718 to separate the upper electrodes 724 from the upper electrical ground conductive layer 732 (e.g., silicon), which is added on top of the gate dielectric layer. This results in structure 540 like those described above. Layer 732 serves the additional purpose of providing a hermetic seal covering the entire memory structure.

The resulting intermediate structure 540 is then processed so that the lower and upper sacrificial layers 518 and 534, respectively, are removed to result in structure 542, as discussed above in connection with FIG. 5.

Figures 1, 8A:
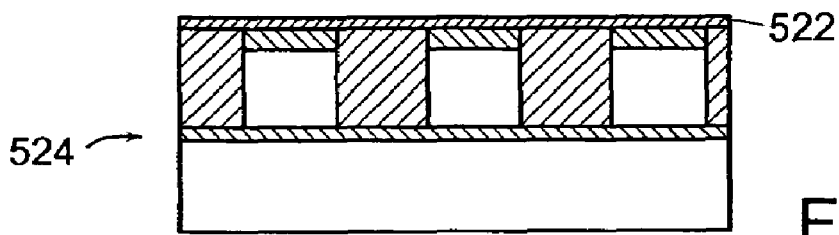
Figures 2, 8A:
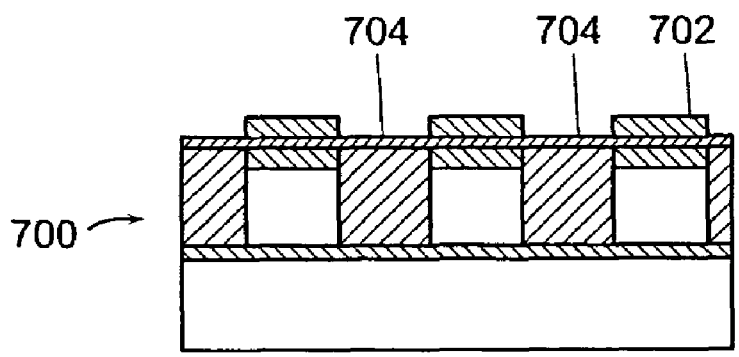
Figures 3, 8A:
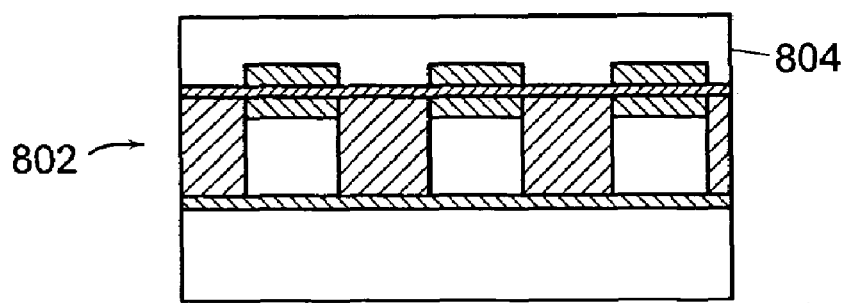
Figures 1, 8B:
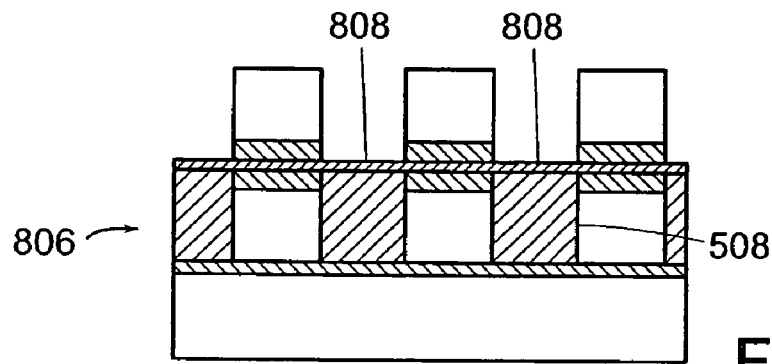
Figures 2, 8B:
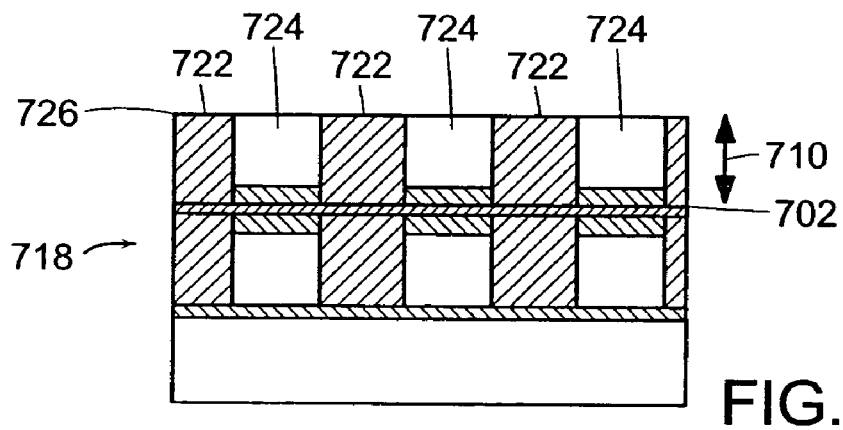
Figures 3, 8B:
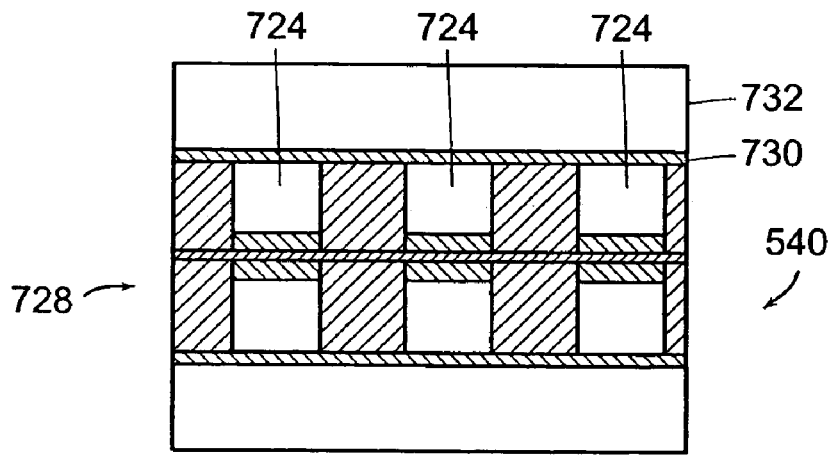
Figure 9A:
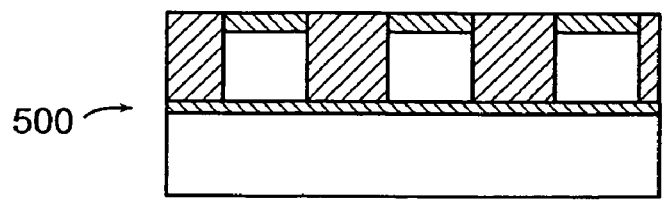
FIG. 9 illustrates exemplary acts of forming electromechanical devices according to certain embodiments of the invention.
Figure 9B:
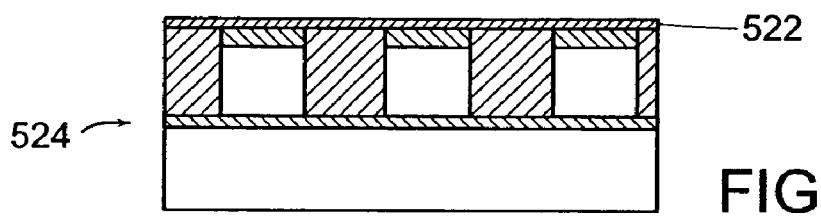
Figure 9C:
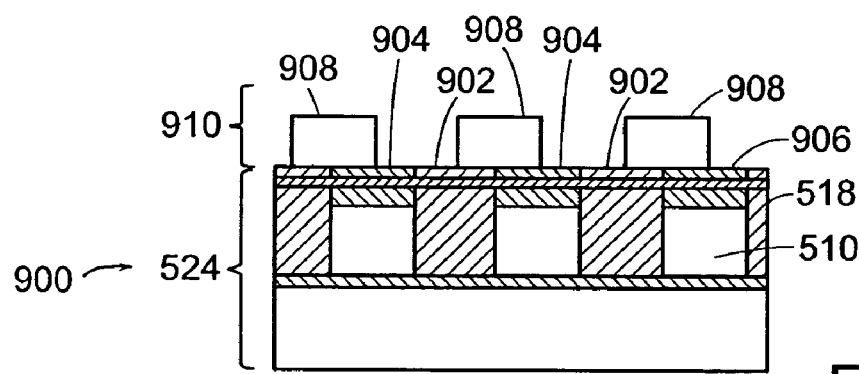
Figure 9D:
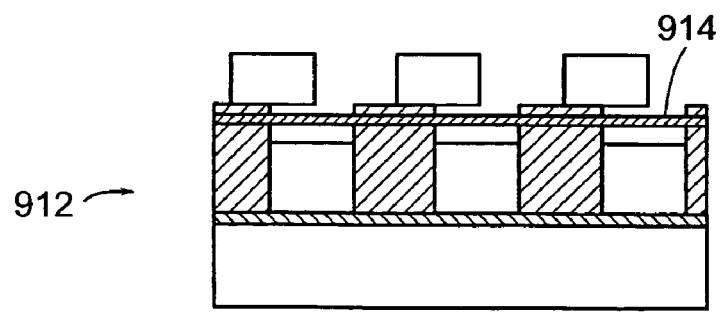

FIGS. 8A-B show another approach for producing a three trace structure 542. Intermediate structure 700 (as explained above) is provided or created. Under this approach, though, the cavities 704 are filled with n-doped silicon or other suitable electrode-forming materials to form a planar layer 804. The electrode layer 804 is backetched with RIE or a plasma to approximately the same height 710 as previously described. A photoresist layer may be spin-coated on layer 804 and subsequently exposed and lithographically developed to begin the creation of cavities 808 which lie directly over the underlying supports 508.

As illustrated in FIG. 8B, reactive ion etching (RIE) or the like may then be used to complete the cavities 808 and to define the upper electrodes. The cavities 808 of intermediate 806 are then filled and covered with a planar insulating layer, consisting, for example, of SOG or polyimide. The insulating layer is backetched with RIE or a plasma to form the supports 722 with a height 710 equal to the total height of the upper sacrificial layer 702 and the upper silicon electrodes 724. The result is intermediate structure 718, with a flat surface 726 as previously described. Substrate 718 is converted into substrate 728 by adding gate dielectric and upper electrical ground layers as described above.

The resulting intermediate structure 540 is then processed so that the lower and upper sacrificial layers 518 and 534, respectively, are removed to result in structure 542, as discussed above in connection with FIG. 5.

Under other embodiments of the invention, from those described above, the upper electrodes are not located directly over the lower electrodes but, instead, are shifted (e.g., displaced by half their width) relative to the lower electrodes. This approach, among other things, facilitates the use of certain techniques for removing sacrificial layers.

FIG. 9 illustrates a method of making these "shifted" embodiments of NTRCM devices. A first intermediate structure 500, as described above, is created or provided. Structure 500 is then converted, as described above, to intermediate 524 featuring patterned nanotube ribbons 522 on top of intermediate 500. Upper insulating supports 902 are deposited onto the lower supports 508, and upper sacrificial layers 904 having the same height as the upper supports 902 are deposited on top of ribbons 522 but in alignment with the lower sacrificial layers 518, so as to create a flat surface 906. The height of the upper sacrificial layers 904 and upper supports 902 is approximately the same as the height of the lower sacrificial layer 518, e.g., 10-20 nm on average. The upper supports 902 and upper sacrificial layers 904 may be made of the same materials as the corresponding lower layers but are not limited to these materials.

Conductive traces 908 of n-type silicon electrodes, or some other suitable material or material combination, are provided on top of the flat surface 906 so that they run parallel to the lower conductive traces 510 and so that at least a portion of the traces 908 (but not their entirety) are aligned with the traces 510. The completed upper array 910 of the resulting intermediate 900 includes upper supports 902, upper sacrificial layers 904, and upper electrodes 908. The upper conductive traces 908 in intermediate 900 are not directly located above the lower electrode traces 510, but are shifted by a certain amount (e.g., by half their width) relative to the lower traces 510.

To generate the freely suspended tristable nanotube junctions 914 of the target structure 912, the lower sacrificial layer 518 and upper sacrificial layer 904 are removed using wet or dry chemical etchants including acids or bases.

The upper traces 908 are shown as having rectangular cross-sections and widths similar to those of the lower supports 508 and lower electrodes 510, but neither the shapes nor the widths of the upper traces 908 is limited to these parameters. Narrower or wider traces of different cross-sections, e.g., trapezoidal or triangular, can be envisioned. Furthermore, while the choice of material for the lower array 524 is somewhat limited so that the materials are compatible with the growth conditions for the carbon nanotubes or nanotube fabrics (e.g., relatively high temperature), the upper array 910 is fabricated after nanotube growth so that a wider variety of materials can be used for the upper supports 902, upper sacrificial layers 904, and upper electrodes 908. For example, materials that are only stable up to relatively low temperatures, such as polyimides, other polymers or low melting point metals (e.g. aluminum), can be used for the upper array 910.

Figure 10:
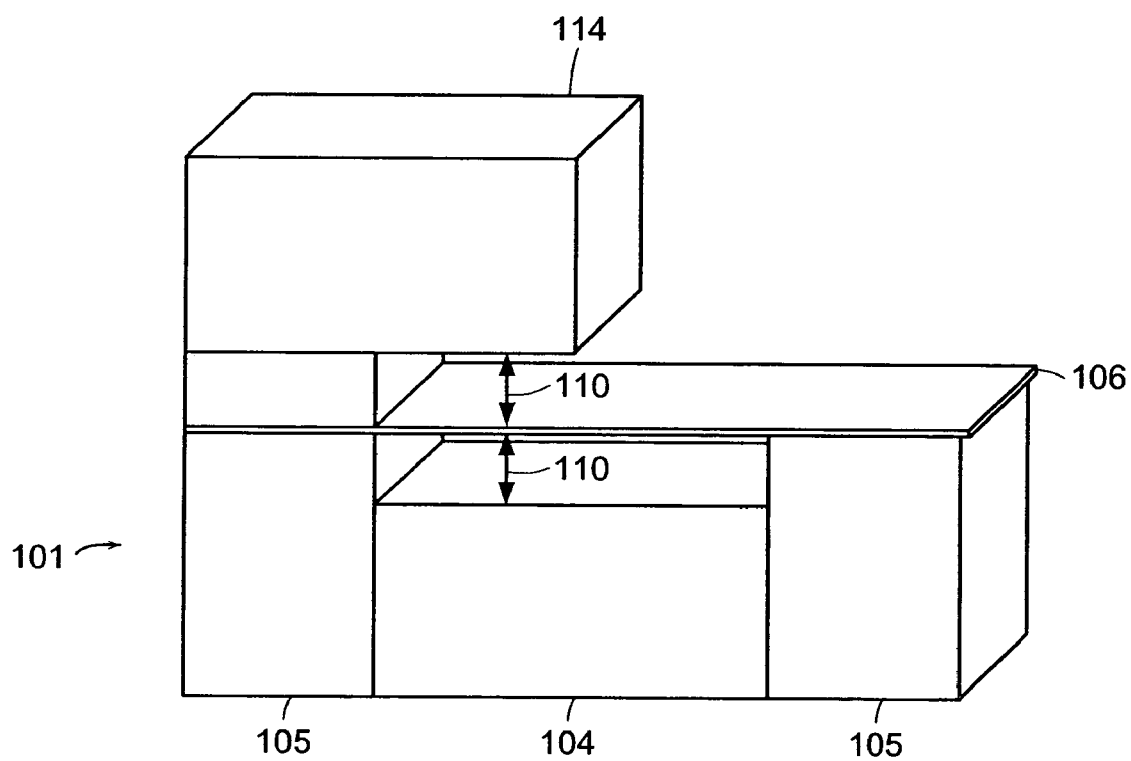
FIGS. 10-12 illustrate three states of a memory cell according to certain embodiments of the invention.
Figure 11:
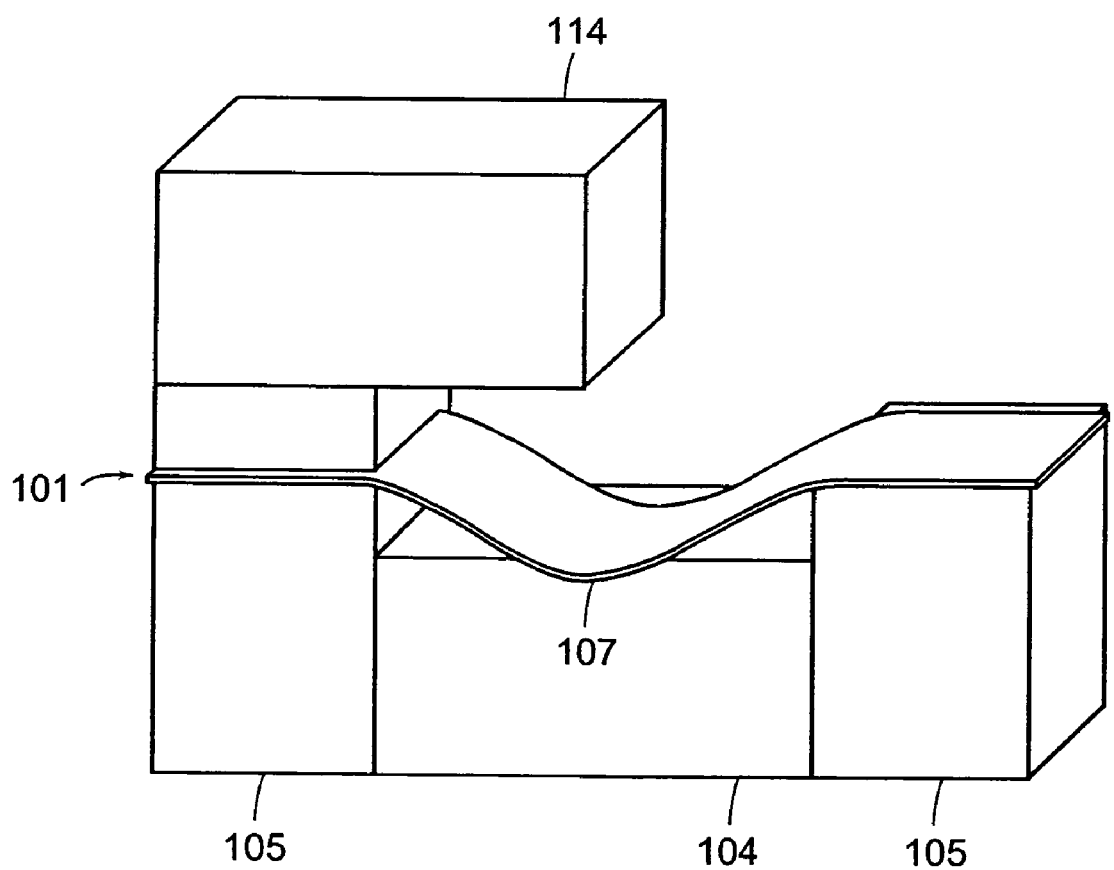
Figure 12:
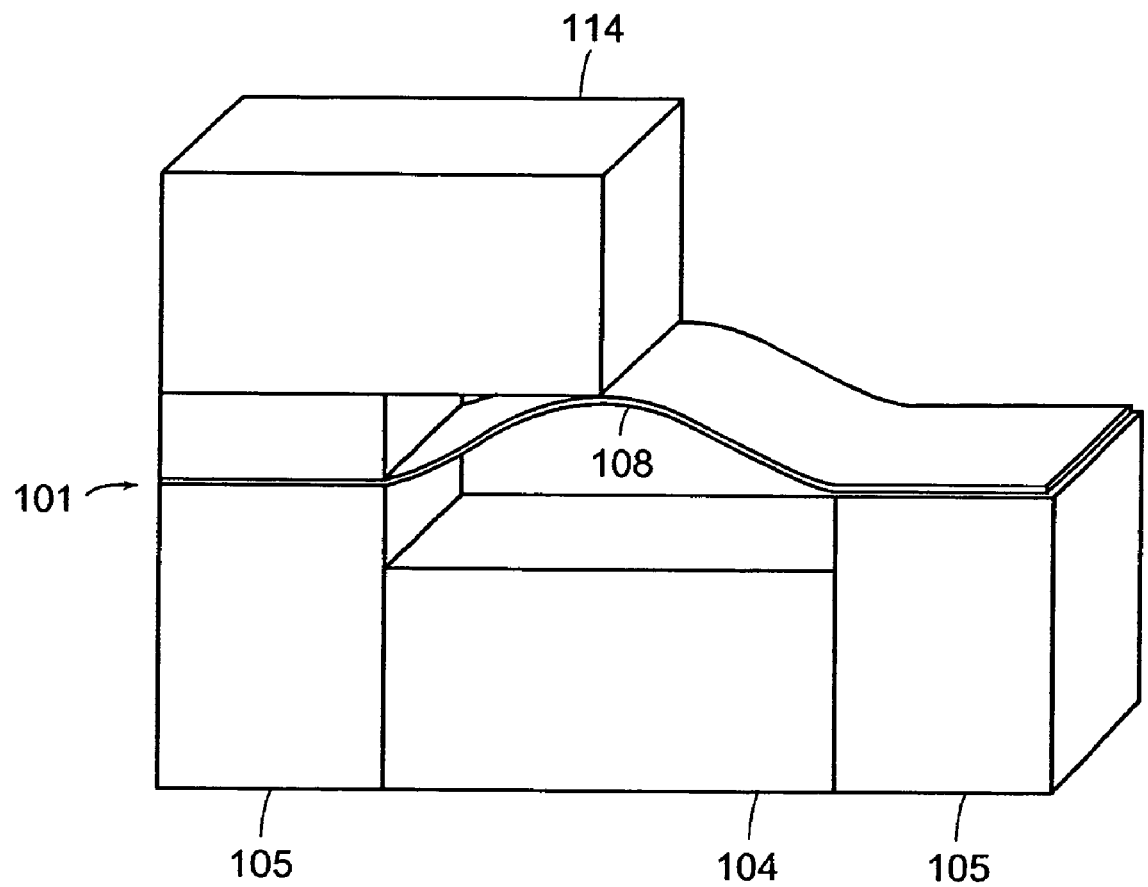

FIGS. 10-12 are cross-sectional diagrams of a cell having a shifted upper electrode and illustrate various states of the device. Analogously to the above embodiments the states may be assigned with some meaning, such as "on" and "off" states, or assigned to non-binary encoding. For example, FIG. 10 shows a junction that may be assigned as an "off" state, whereas FIGS. 11 and 12 show junctions in different "on" states. The description of these states is analogous to that of FIGS. 2-4 and thus will not be repeated. Like reference numerals to those of FIGS. 2-4 have been used to show corresponding features of these embodiments and states.

Figures 1, 13A:
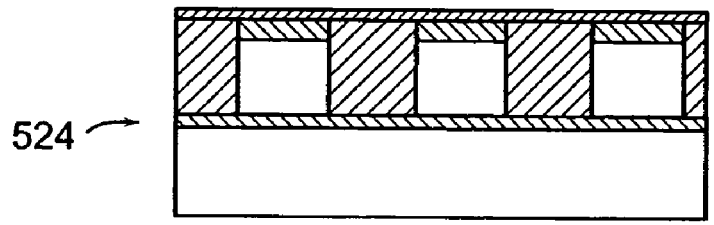
Figures 2, 13A:
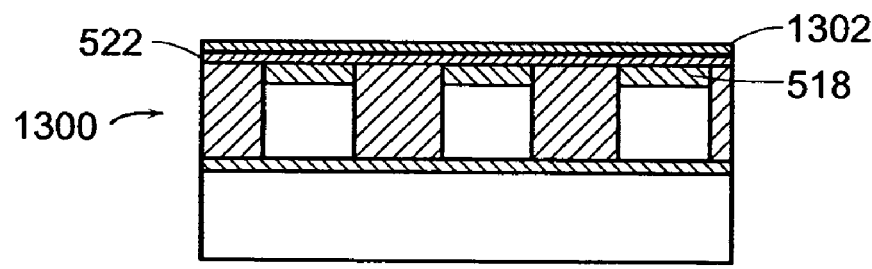
Figures 3, 13A:
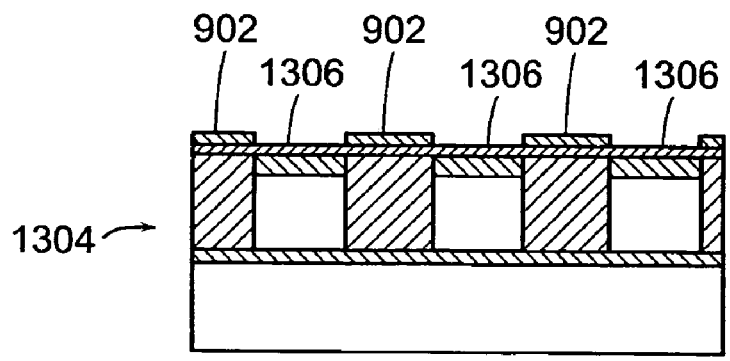
Figures 1, 13B:
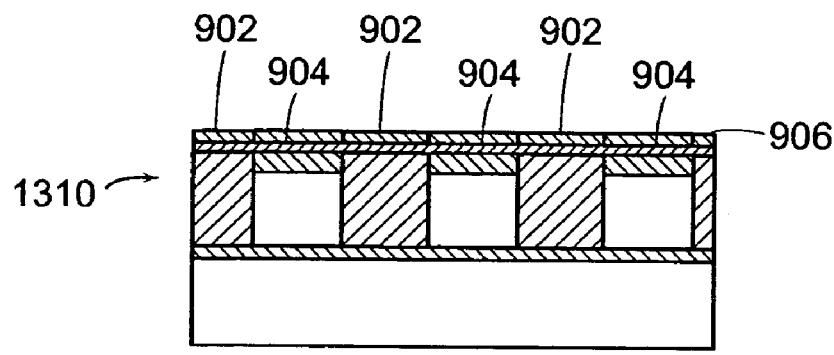
Figures 2, 13B:
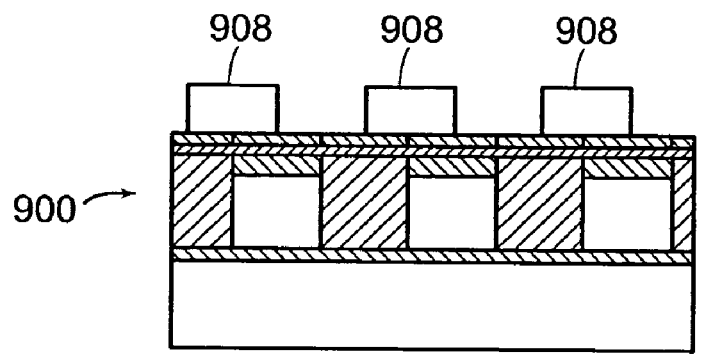
Figures 3, 13B:
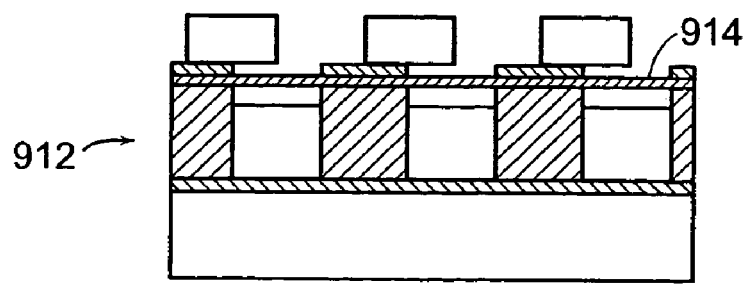

FIGS. 13A-B show one approach for producing a three-trace structure 912. A lower intermediate structure 524 is provided or constructed using the techniques identified above. A support layer 1302 of about the same height as the lower sacrificial layer 518 is deposited to generate intermediate structure 1300. The layer 1302 is then patterned by photolithography and etching techniques, such as RIE, to create the supports 902 and to define cavities 1306 of intermediate structure 1304.

The cavities 1306 are filled with a planar sacrificial layer which is then backetched by RIE or some other etching technique until the sacrificial layer 904 has the same height as the upper supports 902 and a planar surface 906 is formed. The intermediate structure 1310 so formed then has a layer of electrode material, such as n-type silicon, deposited on top of surface 906, which is then patterned by photolithography and etching techniques, such as RIE, to define conductive electrode traces 908 and to form intermediate structure 900.

The upper and lower sacrificial layers 904 and 518 are then removed, as explained in conjunction with FIG. 9, to generate the freely suspended, tristable nanotube junctions 914 of the target structure 912.

Figures 1, 14A:
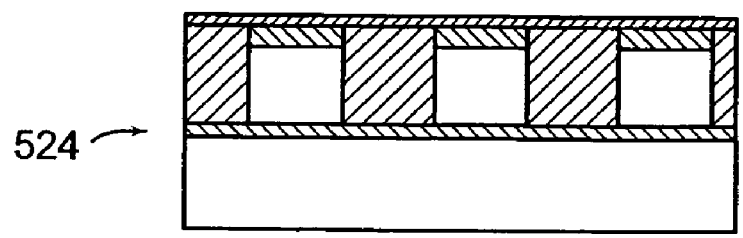
Figures 2, 14A:
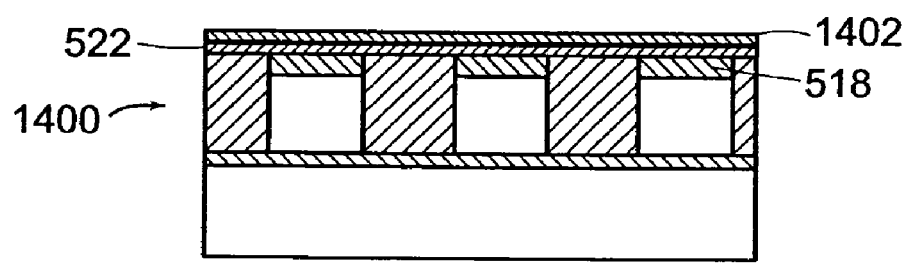
Figures 3, 14A:
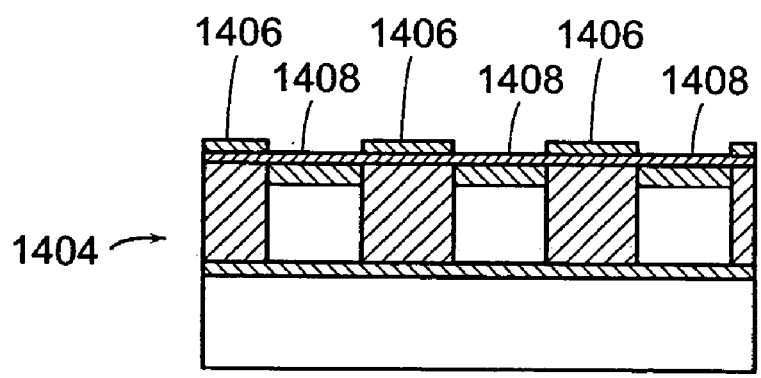
Figures 1, 14B:
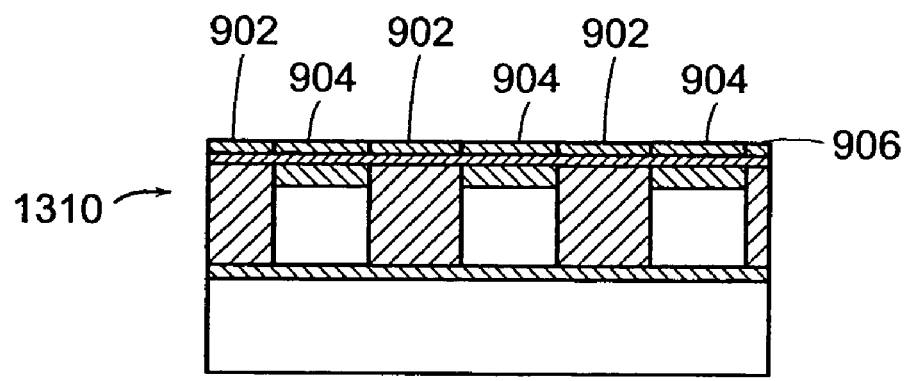
Figures 2, 14B:
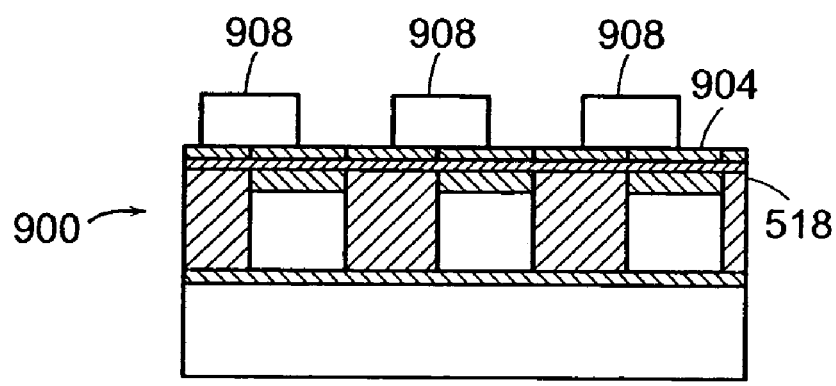
Figures 3, 14B:
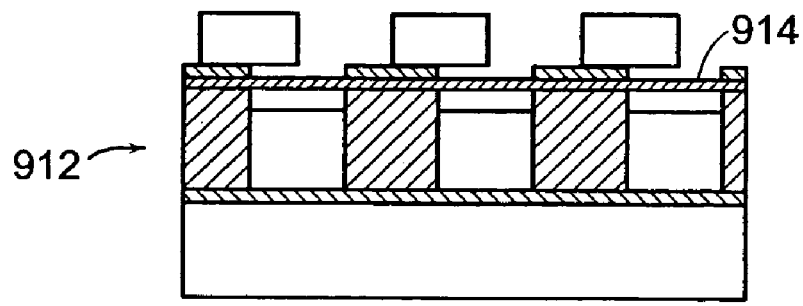
Figure 15A:
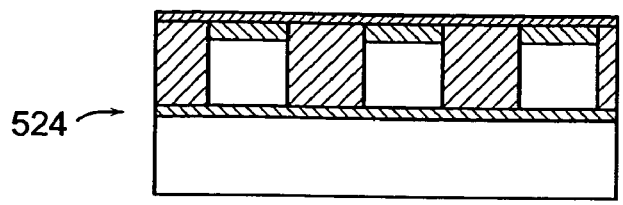
Figure 15B:
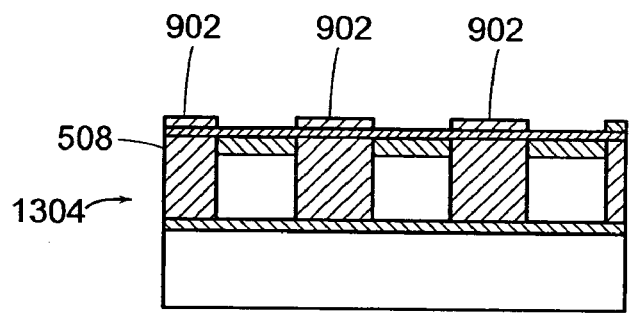
Figure 15C:
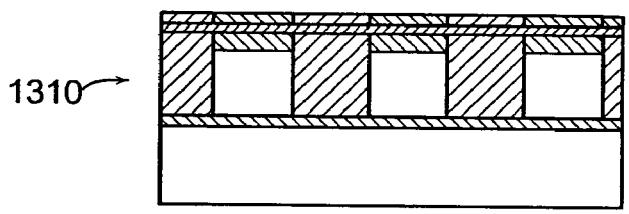
Figure 15D:
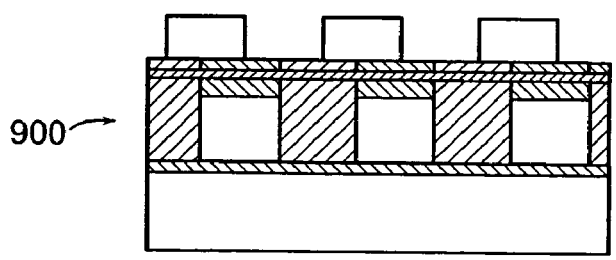
Figure 15E:
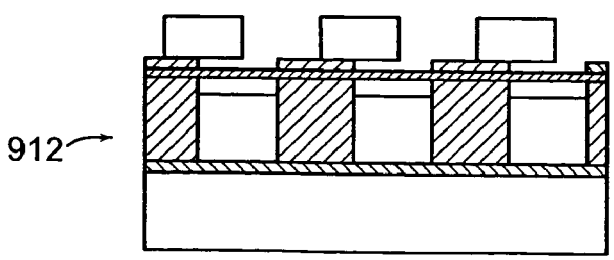
Figure 16A:
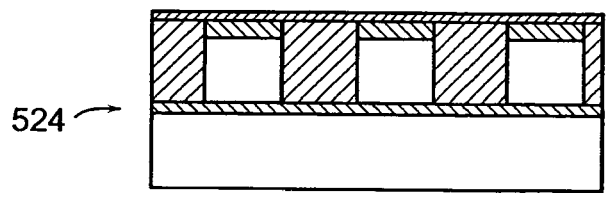
Figure 16B:
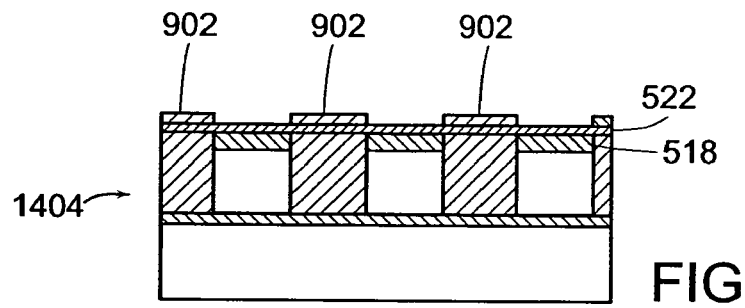
Figure 16C:
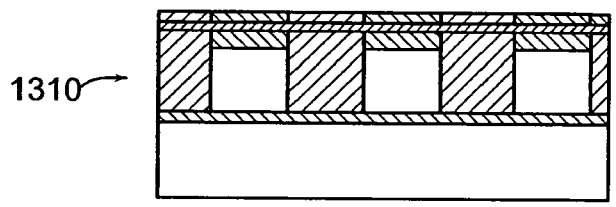
Figure 16D:
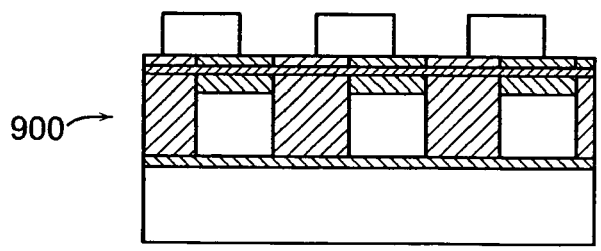
Figure 16E:
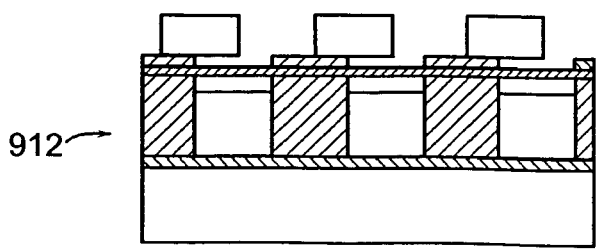
Figure 17A:
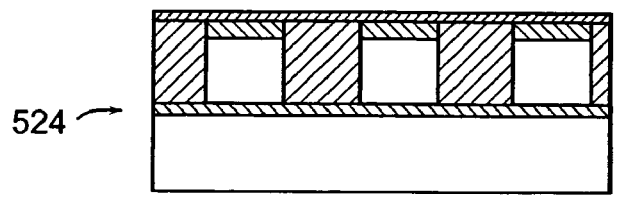
Figure 17B:
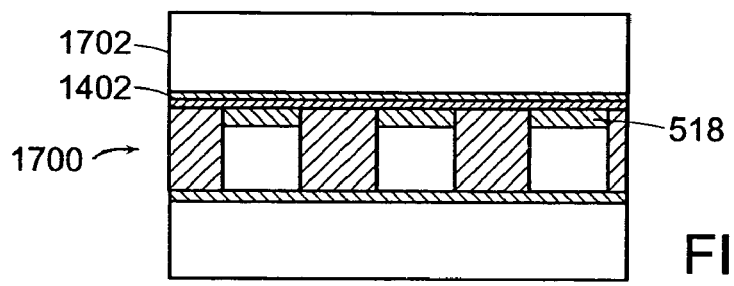
Figure 17C:
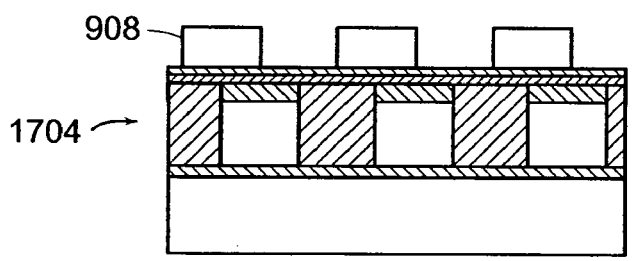
Figure 17D:
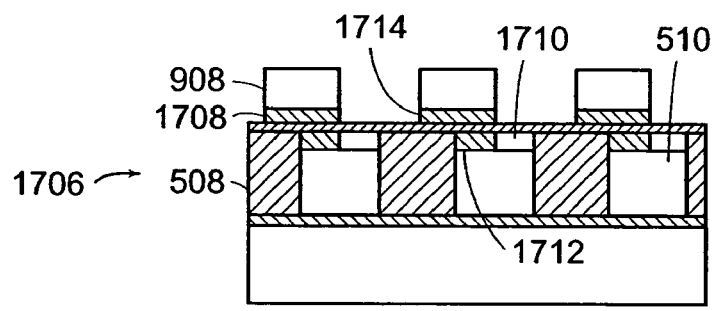
Figure 17E:
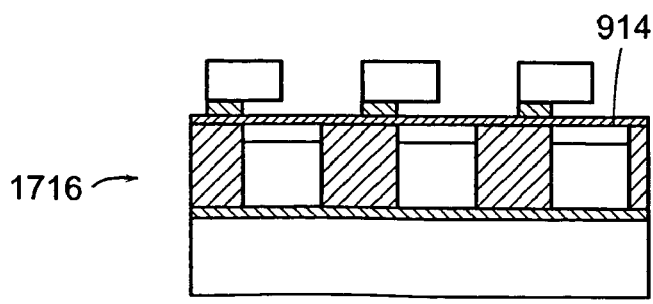

FIGS. 14A-B show another approach for producing a three-trace structure 912. Intermediate structure 524 is provided or created and then transformed into intermediate 1400 by evaporation onto its surface of an upper sacrificial layer 1402 of about the same height as the lower sacrificial layer 518. This sacrificial layer is then patterned by lithography and etching to form sacrificial layer lines 1406 separated by cavities 1408 of intermediate 1404.

The cavities 1408 are then filled by a flat layer of support material which is backetched to the same height as the sacrificial layer lines 904 to form a flat surface 906 and to form intermediate structure 1310. Intermediate 1310 is converted into intermediate 900 as explained in conjunction with FIG. 13B. The upper and lower sacrificial layers 904 and 518 are removed to form the target structure 912 containing freely suspended, tristable nanotube junctions 914.

FIG. 15 shows another approach for producing a three-trace structure 912. First, support layers 902 (about 10-20 nm high) are selectively grown on top of the lower structure 524 directly above the lower supports 508, e.g., by using a selective CVD process involving self-complementary materials such as titanium or silicon dioxide. The resulting intermediate 1304 is then converted successively into intermediate 1310, intermediate 900, and finally the target structure 912, as described above in conjunction with FIG. 13B.

FIG. 16 shows another approach for producing a three-trace structure 912. Sacrificial layers 904 are selectively deposited on the lower array 524 to form intermediate 1404. Intermediate 1404 is then converted via intermediates 1310 and 900 into the target structure 912, as described above in conjunction with FIG. 14B.

FIG. 17 shows another approach for producing a three-trace structure 912. Intermediate 524 is created or provided. A sacrificial layer 1402, made of the same material as the lower sacrificial layer 518, and an electrode layer 1702 are deposited to form structure 1700. The electrode layer 1702 is then patterned by lithography and RIE to form electrode lines 908. Subsequently, the exposed part of the upper and lower sacrificial layers are removed by RIE to form intermediate 1706. The remaining sacrificial material 1708 is located only underneath the electrode lines 908. Where sacrificial material was removed, the now freely suspended nanotube ribbons form junctions 1710 with a freely suspended length, in the embodiment pictured (in which array elements are assumed to have been made as small as possible), of approximately half the resolution limit of the lithography used for patterning.

To form freely suspended, tristable junctions, the part 1712 of the sacrificial material remaining directly above the lower electrodes 510 is removed. This can be accomplished by utilizing the faster differential solubility of this sacrificial material 1712 compared to the sacrificial material 1714 remaining directly above the lower insulating supports 508. The sacrificial material 1712 directly above the lower electrodes dissolves faster because it is more accessible to the etchant than the part 1714 of the remaining sacrificial layer directly above the lower supports 508. As a result, by applying etchant and then stopping the etching process at the appropriate time, the target structure 1716 featuring freely suspended, tristable nanotube junctions 914 can be fabricated.

Figures 1, 18A:
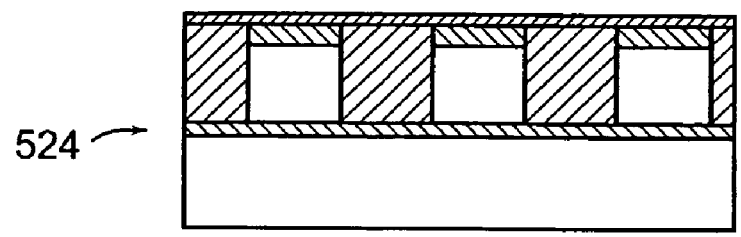
Figures 2, 18A:
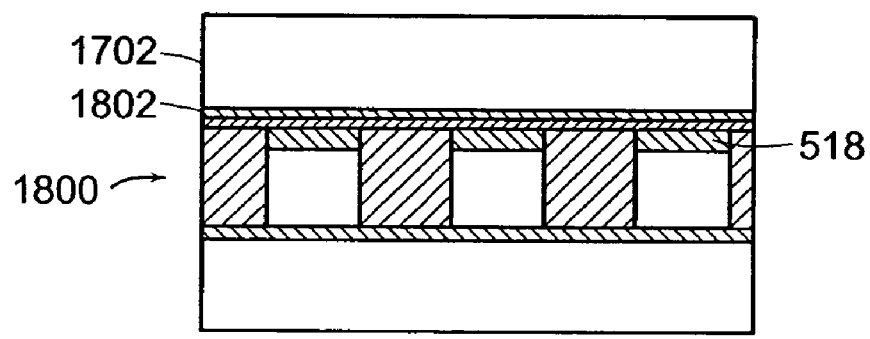
Figures 3, 18A:
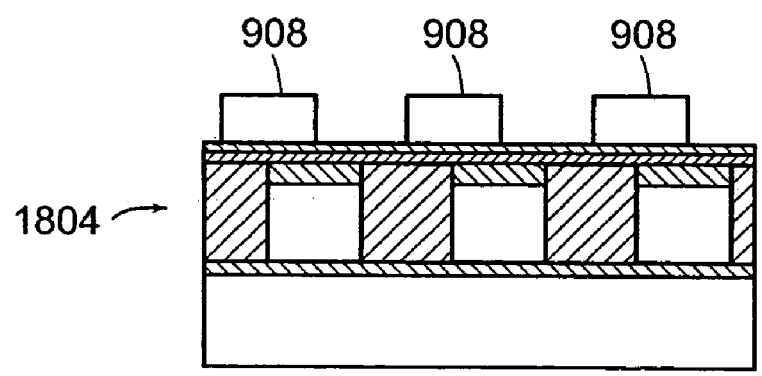
Figures 1, 18B:
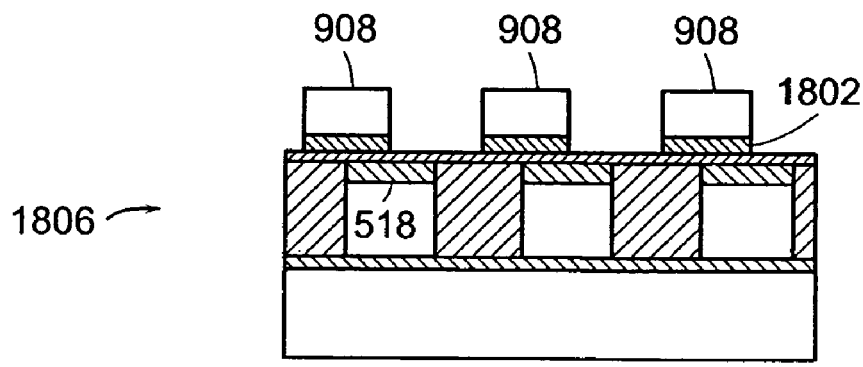
Figures 2, 18B:
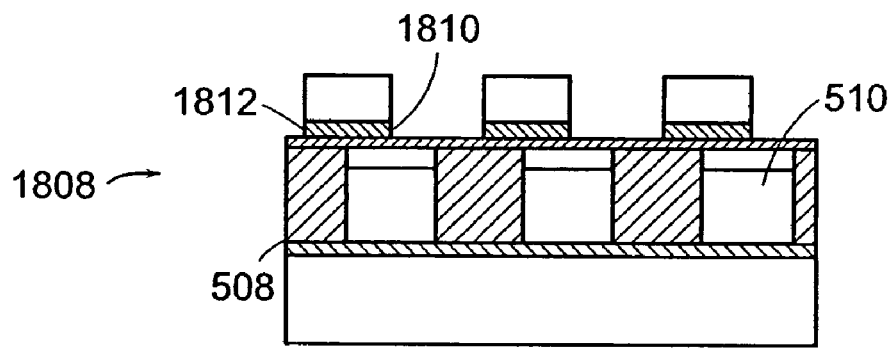
Figures 3, 18B:
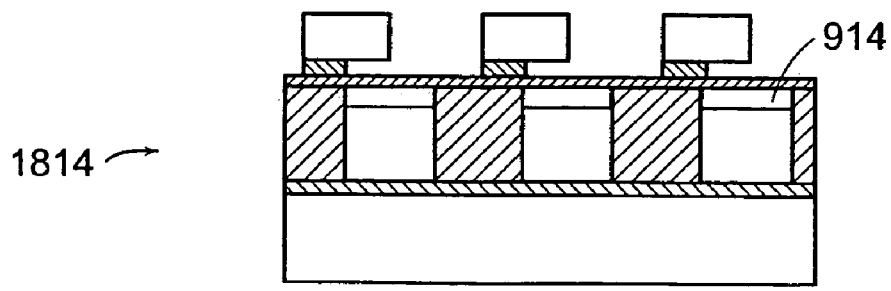

FIGS. 18A-B illustrate yet another approach for producing a three-trace structure 912. Intermediate 1800 is produced by evaporating a sacrificial layer 1802 and an electrode material layer 1702 onto intermediate 524. The upper sacrificial layers 1802 are made of a material that has different etching characteristics than the lower sacrificial layers 518.

The electrode material layer 1702 is patterned to form the electrode lines 908 of intermediate 1804. Subsequently, the exposed region of the sacrificial layer 1802 in between electrodes 908 is removed by RIE to form intermediate 1806 of FIG. 18B. Then the lower sacrificial layer 518 is removed by etching to form intermediate 1808. The remaining portions 1810 of the upper sacrificial layers directly above the lower electrodes 510 are removed by utilizing their higher differential solubility compared to the portions 1812 of sacrificial material directly above the lower supports 508. Because sacrificial material 1810 directly above the lower electrodes is much more easily accessed than sacrificial material 1812 directly above the lower supports, the material directly above the lower electrodes etches faster. Thus, by applying etchant but stopping the etching process at the appropriate time, the freely suspended, tristable junctions 914 of the target structure 1814 can be generated.

Additional Embodiments

In general, it should be noted that the feature sizes described above are suggested in view of modern manufacturing techniques. Other embodiments may be made with much smaller (or larger) sizes that reflect manufacturing capabilities.

The target structures and processes described above do not exhaust the range of embodiments of the present invention. Subsequent metallization may be used to add addressing electrodes to an array of tristable junctions such as that pictured in FIG. 1. Other embodiments could use nanotube technology, whether in individual wire or belt form, to implement addressing of memory cells instead of using metallized electrodes and CMOS addressing logic (not shown). Such potential use of nanotube technology to select memory cells for reading or writing operations would further integrate nanotubes into system design and might add beneficial functionality to higher-level system design. For example, under this approach of using nanotube technology for both memory and addressing, the memory architecture could inherently store the last memory address as well as memory contents in a nonvolatile manner.

Another set of embodiments would use different materials in place of the nanotube ribbons described above. Of course, individual nanotubes could be used instead of ribbons, albeit with the disadvantages relative to ribbons discussed above. In addition, other materials with electronic and mechanical properties suitable for electromechanical switching could be envisioned. These materials would have properties similar to carbon nanotubes but with different and likely reduced tensile strength. For a material to qualify, its tensile strain and adhesion energies would need to fall within a range that allowed for bistability or tristability, and that ensured that required electromechanical switching properties exist within acceptable tolerances.

Other embodiments could feature additional electrodes consisting of n-doped silicon on top of some metal or semiconductor conductive traces. The additional electrodes would provide rectifying junctions in the ON state so that no multiple current pathways exist.

Embodiments could also feature any of various other widely accepted and used methods to prevent the occurrence of electrical crosstalk (i.e., multiple current pathways) in crossbar arrays. Tunnel barriers could be added on top of the static, lithographically fabricated electrodes to prevent the formation of ohmic ON states. In such embodiments, no leakage currents would occur at zero bias voltage, and a small bias voltage would have to be applied for any significant number of charge carriers to overcome the barrier and tunnel between crossing traces.

Additional embodiments could make use of methods to increase adhesion energies through the use of ionic, covalent or other forces to alter the interactions between the electromechanical switching elements and the electrode surfaces. Such methods can be used to extend the range of bistability and tristability within the junctions.

Further embodiments could be produced by functionalizing nanotubes with planar conjugated hydrocarbons such as pyrenes. These hydrocarbons could enhance the internal adhesion between nanotubes within the ribbons.

Moreover, many of the above benefits may be achieved by embodiments that do not utilize the "sandwich-type" of architecture of having the electromechanically-responsive element disposed between two electrodes. For example, two generally parallel traces disposed on one side of the electromechanically-responsive element may improve fault tolerance and the like.

In addition, certain embodiments used a shifted upper trace to define an opening to the sacrificial layers to facilitate the removal of the sacrificial layers. Other approaches may be used to define such openings, for example, by shaping the upper trace appropriately to define such an opening.

It will be further appreciated that the scope of the present invention is not limited to the above-described embodiments, but rather is defined by the appended claims, and that these claims will encompass modifications of and improvements to what has been described.

What is claimed is:

1. A method of producing an electromechanical circuit element, the method comprising:
providing a first structure having first support structures and a first electrically conductive element;
providing a conductive trace of defined orientation on a surface of the first structure so as to contact the first support structures, wherein the trace comprises a plurality of unaligned nanotubes; and
providing a second structure having second support structures and a second electrically conductive element, wherein the second support structures contact the trace and pin the trace to the first support structure.

2. The method of claim 1, further wherein at least one of the upper and lower structures includes a region having sacrificial material in contact with the trace, and wherein the method includes the removal of the material.

3. The method of claim 2, wherein the sacrificial material is removed by an etchant, and further wherein the etchant diffuses through the trace.

4. The method of claim 1, wherein the first conductive element has a defined orientation that is substantially perpendicular to the defined orientation of the trace.

5. The method of claim 4, wherein the second conductive element has a defined orientation that is substantially parallel to the defined orientation of the first conductive element.

6. The method of claim 5, wherein the first and second conductive elements are shifted relative to one another in a direction perpendicular to their substantially defined orientation.

7. The method of claim 1, wherein the conductive trace of defined orientation is made by selectively removing material from a plurality of unaligned nanotubes.

8. The method of claim 1, wherein the conductive trace is substantially a monolayer of nanotubes.

9. The method of claim 1, further comprising functionalizing the nanotubes with planar conjugated hydrocarbons.

10. The method of claim 9, wherein the hydrocarbons are pyrenes.

11. A method of producing an electromechanical circuit element, the method comprising:
providing a first structure;
providing a conductive trace of defined orientation on a surface of the first structure so as to contact the first structure, wherein the trace comprises a plurality of unaligned nanotubes; and
providing a second structure in contact with the trace, wherein the second structure pins the trace to the first structure.

12. The method of claim 11, wherein the first conductive element has a defined orientation that is substantially perpendicular to the defined orientation of the trace.

13. The method of claim 12, wherein the second conductive element has a defined orientation that is substantially parallel to the defined orientation of the first conductive element.

14. The method of claim 13, wherein the first and second conductive elements are shifted relative to one another in a direction perpendicular to their substantially defined orientation.

15. The method of claim 11, wherein the conductive trace of defined orientation is made by selectively removing material from a plurality of unaligned nanotubes.

16. The method of claim 11, wherein the conductive trace is substantially a monolayer of nanotubes.

* * * * *